US012707670B2

(12) United States Patent
Choi et al.

(10) Patent No.: US 12,707,670 B2
(45) Date of Patent: Aug. 11, 2026

(54) SEMICONDUCTOR DEVICES HAVING CONTACT PLUGS

(71) Applicant: SAMSUNG ELECTRONICS CO., LTD., Suwon-si (KR)

(72) Inventors: Seongheum Choi, Suwon-si (KR); Chunghwan Shin, Suwon-si (KR); Rakhwan Kim, Suwon-si (KR); Yeji Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 419 days.

(21) Appl. No.: 18/216,640

(22) Filed: Jun. 30, 2023

(65) Prior Publication Data

US 2024/0170546 A1 May 23, 2024

(30) Foreign Application Priority Data

Nov. 18, 2022 (KR) ........................ 10-2022-0155159

(51) Int. Cl.
*H10D 30/62* (2025.01)
*H10D 30/00* (2025.01)
(Continued)

(52) U.S. Cl.
CPC ....... *H10D 30/6219* (2025.01); *H10D 30/508* (2025.01); *H10D 30/6211* (2025.01);
(Continued)

(58) Field of Classification Search
CPC ............... H10D 30/6219; H10D 30/43; H10D 30/6211; H10D 30/6729; H10D 30/6735;
(Continued)

(56) References Cited

U.S. PATENT DOCUMENTS 8,501,620 B2 * 8/2013 Chandrashekar ............................ H01L 21/28556 438/720
10,847,367 B2 * 11/2020 Economy ............ H01L 21/0257
(Continued)

FOREIGN PATENT DOCUMENTS

JP 2001085642 A 3/2011
KR 10-2003-0057616 7/2003
(Continued)

*Primary Examiner* — Earl N Taylor
(74) *Attorney, Agent, or Firm* — Morgan, Lewis & Bockius LLP

(57) ABSTRACT

A semiconductor device includes: an active fin disposed on a substrate and protruding from an upper surface of the substrate; a gate structure disposed on the active fin; a source/drain layer disposed on a portion of the active fin adjacent to the gate structure; an ohmic contact pattern on the source/drain layer; and a contact plug disposed on an upper surface of the ohmic contact pattern, wherein the contact plug includes: a conductive structure including a metal; and a barrier pattern covering a lower surface and a sidewall of the conductive structure, wherein a thickness of the barrier pattern is equal to or less than about 10 Å, and wherein a maximum diameter of a grain of the metal included in the conductive structure is in a range of about 8 nm to about 15 nm.

21 Claims, 38 Drawing Sheets

(51) Int. Cl.

| | |
|---|---|
| ***H10D 62/10*** | (2025.01) |
| ***H10D 64/01*** | (2025.01) |
| ***H10D 64/23*** | (2025.01) |
| ***H10D 64/62*** | (2025.01) |
| ***H10D 84/01*** | (2026.01) |
| ***H10D 84/83*** | (2025.01) |
| *H10D 30/01* | (2025.01) |

(52) U.S. Cl.
CPC ......... *H10D 62/121* (2025.01); *H10D 64/017* (2025.01); *H10D 64/256* (2025.01); *H10D 64/62* (2025.01); *H10D 84/0158* (2025.01); *H10D 84/83125* (2025.01); *H10D 84/832* (2025.01); *H10D 84/834* (2025.01); *H10D 30/019* (2025.01); *H10D 30/024* (2025.01)

(58) Field of Classification Search
CPC ............. H10D 30/6757; H10D 62/121; H10D 64/017; H10D 30/024; H10D 30/014; H10D 30/0212; H10D 30/62; H10D 30/797; H10D 62/151; H10D 30/6713; H10D 64/251–259; H10D 30/501–509; H01L 29/78696; H01L 29/785; H01L 29/7848; H01L 29/78618; H01L 29/7851; H01L 29/775; H01L 29/66795; H01L 29/66545; H01L 29/66439; H01L 29/665; H01L 29/42392; H01L 29/41766; H01L 29/41791; H01L 29/41733; H01L 29/0847; H01L 29/0673
See application file for complete search history.

(56) References Cited

U.S. PATENT DOCUMENTS

| | | | | |
|---|---|---|---|---|
| 11,538,916 | B2 * | 12/2022 | Hwang | H10D 64/62 |
| 11,631,769 | B2 * | 4/2023 | Kim | H01L 23/53266<br>257/288 |
| 11,837,645 | B2 * | 12/2023 | Hwang | H01L 21/76805 |
| 12,419,086 | B2 * | 9/2025 | Kim | H10D 30/6735 |
| 2018/0269297 | A1 * | 9/2018 | Zhang | H10D 30/62 |
| 2018/0315647 | A1 * | 11/2018 | Wang | H01L 21/76868 |
| 2020/0373387 | A1 * | 11/2020 | Lee | H10D 84/0158 |
| 2021/0202747 | A1 * | 7/2021 | Young | H10D 30/024 |
| 2021/0217861 | A1 * | 7/2021 | Song | H10D 64/258 |
| 2021/0320034 | A1 * | 10/2021 | Lei | H01L 21/2855 |
| 2021/0327877 | A1 * | 10/2021 | Lee | H10D 62/822 |
| 2022/0068709 | A1 * | 3/2022 | Wang | H01L 23/53266 |
| 2022/0069100 | A1 * | 3/2022 | Hwang | H10D 84/038 |
| 2022/0069129 | A1 * | 3/2022 | Kim | H01L 23/53266 |
| 2022/0246528 | A1 * | 8/2022 | Choi | H01L 21/76879 |
| 2023/0335606 | A1 * | 10/2023 | Lee | H10D 30/6219 |
| 2024/0145387 | A1 * | 5/2024 | Lee | H10D 30/62 |

FOREIGN PATENT DOCUMENTS

| | | |
|---|---|---|
| KR | 10-2005-0012580 | 7/2003 |
| KR | 10-2006-0104884 | 10/2006 |
| KR | 10-0831679 | 5/2008 |
| KR | 10-946036 | 3/2010 |
| KR | 10-1075527 | 10/2011 |
| KR | 1020160129372 A | 11/2016 |
| KR | 1020220098963 A | 7/2022 |

* cited by examiner

SEMICONDUCTOR DEVICES HAVING CONTACT PLUGS

CROSS-REFERENCE TO RELATED APPLICATION

This application claims priority under 35 USC § 119 to Korean Patent Application No. 10-2022-0155159, filed on Nov. 18, 2022 in the Korean Intellectual Property Office (KIPO), the disclosure of which is incorporated by reference herein in its entirety.

TECHNICAL HELD

Example embodiments of the present inventive concept relate to semiconductor devices. More particularly, example embodiments of the present inventive concept relate to semiconductor devices having contact plugs.

DISCUSSION OF THE RELATED ART

Generally, in a semiconductor device, a contact plug may connect a source/drain layer to an upper wiring. As the aspect ratio of the contact plug increases and the diameter thereof decreases, it becomes desirable for the contact plug to have a relatively low resistance.

SUMMARY

According to an example embodiment of the present inventive concept, a semiconductor device includes: an active fin disposed on a substrate and protruding from an upper surface of the substrate; a gate structure disposed on the active fin; a source/drain layer disposed on a portion of the active fin adjacent to the gate structure; an ohmic contact pattern on the source/drain layer; and a contact plug disposed on an upper surface of the ohmic contact pattern, wherein the contact plug includes: a conductive structure including a metal; and a barrier pattern covering a lower surface and a sidewall of the conductive structure, wherein a thickness of the barrier pattern is equal to or less than about 10 Å, and wherein a maximum diameter of a grain of the metal included in the conductive structure is in a range of about 8 nm to about 15 nm.

According to an example embodiment of the present inventive concept, a semiconductor device includes: a plurality of channels disposed on a substrate and spaced apart from each other on the substrate in a vertical direction substantially perpendicular to an upper surface of the substrate; a gate structure disposed on the substrate and at least partially covering upper and lower surfaces and a sidewall of each of the plurality of channels; a source/drain layer disposed on a portion of the substrate and at opposite sides of the gate structure; and a contact plug structure disposed on the source/drain layer, wherein the contact plug structure includes: a conductive structure including a metal; and a barrier pattern covering a lower surface and a sidewall of the conductive structure, wherein the conductive structure includes: a second conductive pattern; and a first conductive pattern covering a lower surface and a sidewall of the second conductive pattern, and wherein each of the first and second conductive patterns includes a metal, and does not include boron or silicon.

According to an example embodiment of the present inventive concept, a semiconductor device includes: a plurality of channels disposed on a substrate and spaced apart from each other in a vertical direction substantially perpendicular to an upper surface of the substrate; a gate structure disposed on the substrate and at least partially covering upper and lower surfaces and a sidewall of each of the plurality of channels; a source/drain layer disposed on a portion of the substrate and at opposite sides of the gate structure; an ohmic contact pattern disposed on the source/drain layer; and a first contact plug structure disposed on the ohmic contact pattern, wherein the first contact plug structure includes: a conductive structure including a metal; and a barrier pattern covering a lower surface and a sidewall of the conductive structure, wherein a thickness of the barrier pattern is equal to or less than about 10 Å, wherein a maximum diameter of a grain in the metal included in the conductive structure is in a range of about 8 nm to about 15 nm.

DETAILED DESCRIPTION OF THE EMBODIMENTS

A semiconductor device and a method of manufacturing the same in accordance with example embodiments of the present inventive concept will be described more fully hereinafter with reference to the accompanying drawings. Hereinafter in the specifications (and not necessarily in the claims), two directions among horizontal directions, which may be substantially parallel to an upper surface of a substrate and may cross each other, may be referred to as first and second directions D1 and D2, respectively, and a vertical direction substantially perpendicular to the upper surface of the substrate may be referred to as a third direction D3. In some example embodiments of the present inventive concept, the first and second directions D1 and D2 may be substantially perpendicular to each other.

Figure 1:
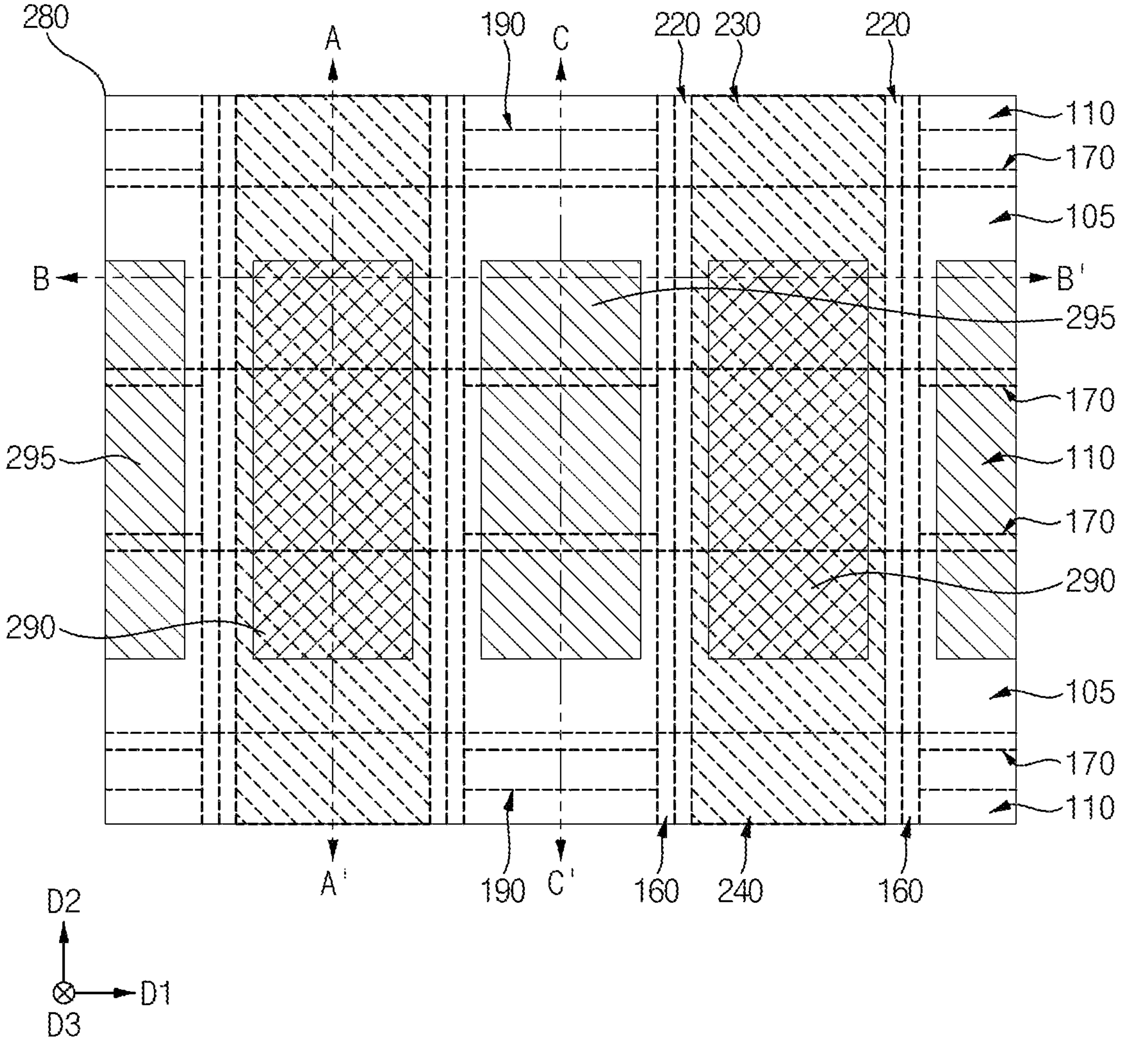
FIGS. 1, 2, 3 and 4 are a plan view and cross-sectional views illustrating a semiconductor device in accordance with example embodiments of the present inventive concept.
Figure 2:
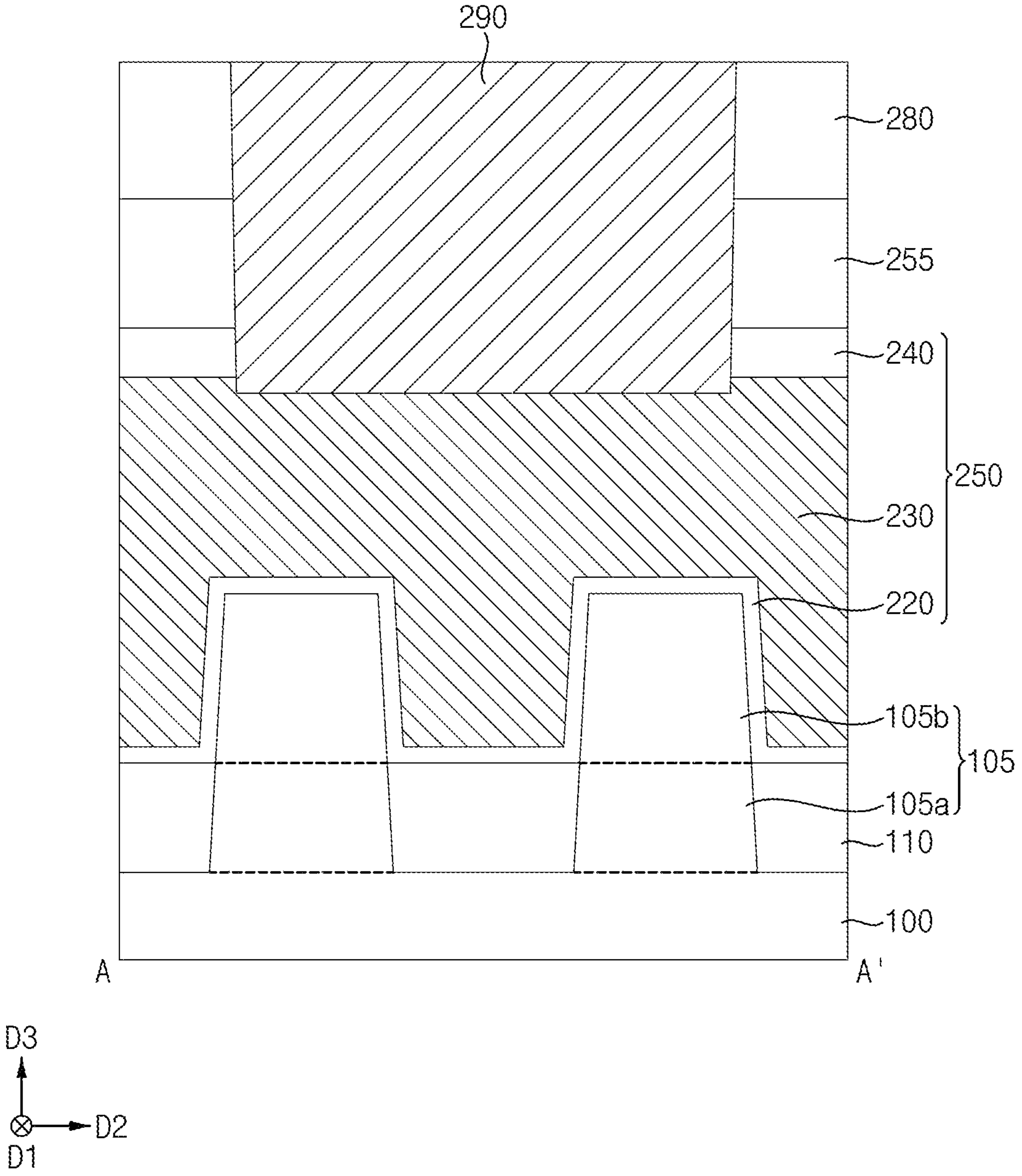
Figure 3:
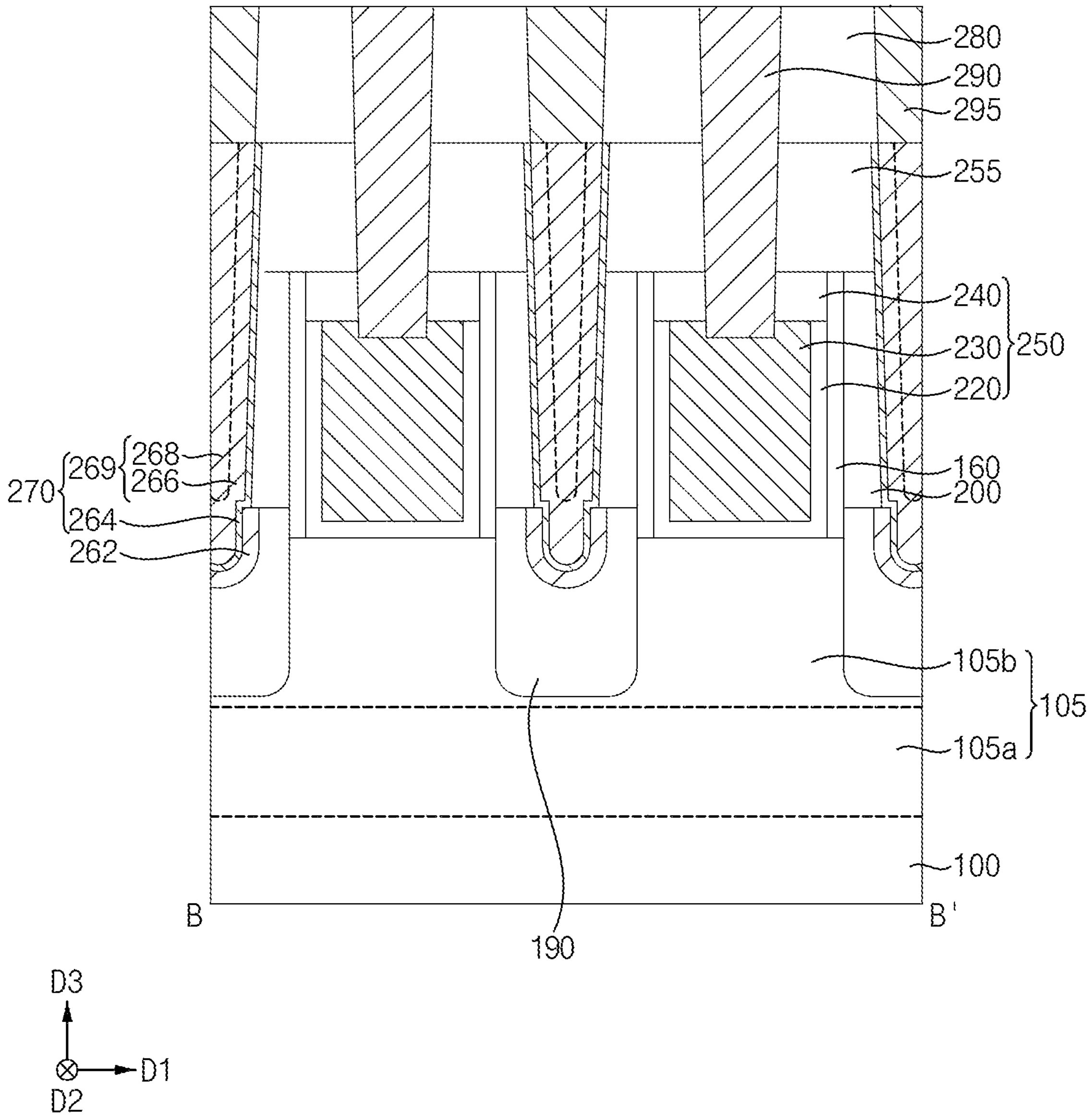
Figure 4:
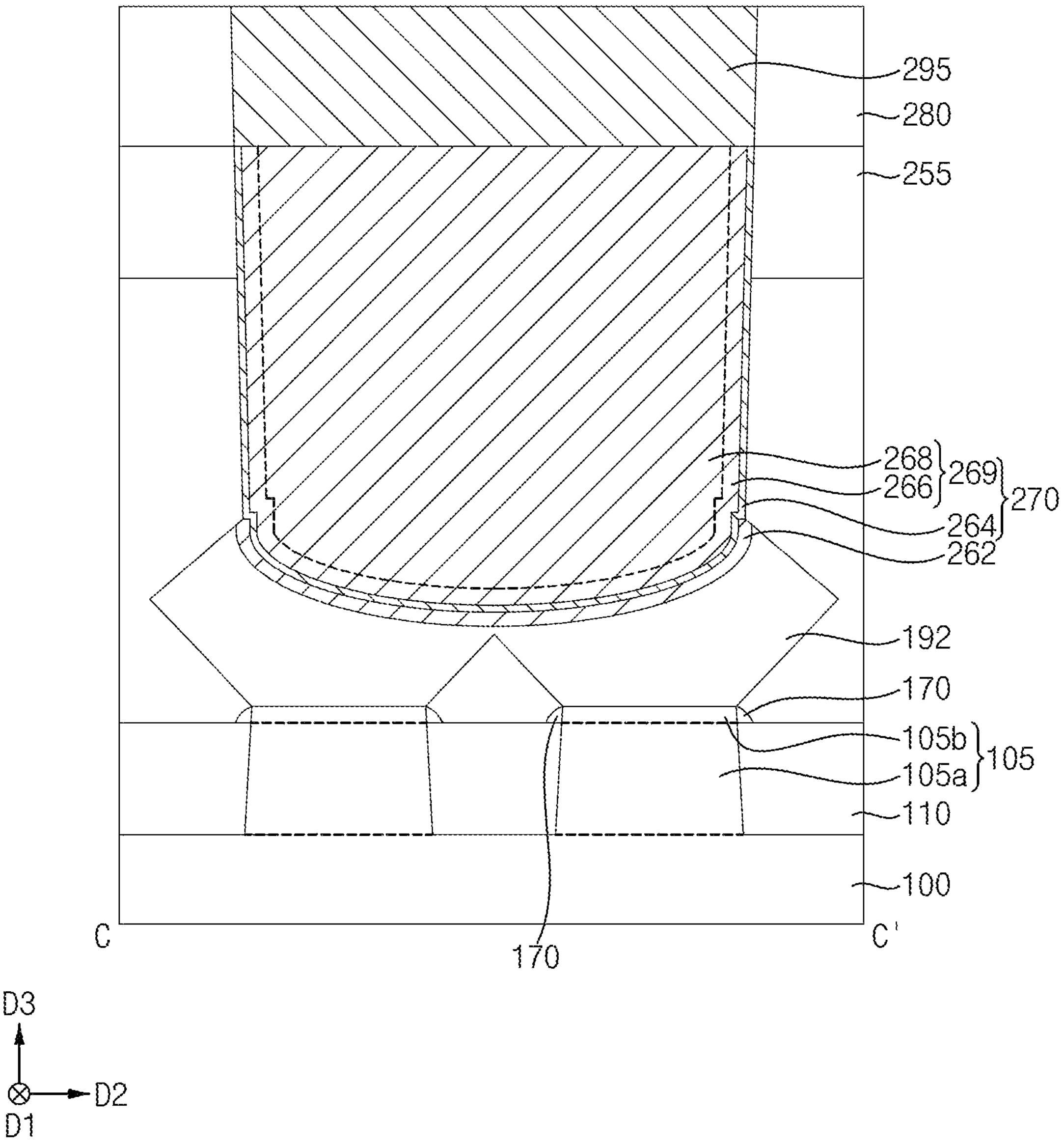

FIGS. 1 to 4 are a plan view and cross-sectional views illustrating a semiconductor device in accordance with example embodiments of the present inventive concept. For example, FIG. 1 is the plan view, and FIGS. 2 to 4 are the cross-sectional views. FIG. 2 is a cross-sectional view taken along line A-A' of FIG. 1. FIG. 3 is a cross-sectional view taken along line B-B' of FIG. 1, and FIG. 4 is a cross-sectional view taken along line C-C' of FIG. 1.

Referring to FIGS. 1 to 4, the semiconductor device may include a first gate structure 250, a first source/drain layer 190 and a first contact plug structure 270 disposed on a substrate 100.

Additionally, the semiconductor device may include a first active pattern 105, a first gate spacer 160, a fin spacer 170, a first ohmic contact pattern 262, first to third insulating interlayers 200, 255 and 280, a second contact plug 290 and a first via 295.

The substrate 100 may include a semiconductor material, e.g., silicon, germanium, silicon-germanium, etc., or semiconductor compounds, e.g., GaP, GaAs, GaSb, etc. In some embodiments of the present inventive concept, the substrate 100 may include a silicon-on-insulator (SOI) substrate or a germanium-on-insulator (GOI) substrate.

The first active pattern 105 may have a fin-like shape protruding from an upper surface of the substrate 100, and thus may also be referred to as a first active fin. A lower sidewall of the first active pattern 105 may be covered by a first isolation pattern 110. The substrate 100 may include a field region, on which the first isolation pattern 110 is formed, and an active region, on which the first active pattern 105 is formed.

The first active pattern 105 may include a first lower active pattern 105*a*, of which a sidewall is covered by the first isolation pattern 110, and a first upper active pattern 105*b*, of which a sidewall is not covered by the first isolation pattern 110. For example, the first upper active pattern 105*b* may be disposed above the first isolation pattern 110. In some example embodiments of the present inventive concept, the first active pattern 105 may extend in the first direction D1, and a plurality of first active patterns 105 may be spaced apart from each other in the second direction D2.

The first active pattern 105 may include a material substantially the same as that of the substrate 100, and the first isolation pattern 110 may include an oxide, e.g., silicon oxide.

In some example embodiments of the present inventive concept, the first gate structure 250 may extend in the second direction D2 on the first active pattern 105 and the first isolation pattern 110 on the substrate 100, and a plurality of first gate structures 250 may be spaced apart from each other in the first direction D1.

In some example embodiments of the present inventive concept, the first gate structure 250 may include a first gate insulation pattern 220, a first gate electrode 230 and a first capping pattern 240 sequentially stacked on the first active pattern 105 and the first isolation pattern 110. The first gate insulation pattern 220 may cover a lower surface and a sidewall of the first gate electrode 230, and the first capping pattern 240 may contact upper surfaces of the first gate electrode 230 and the first gate insulating pattern 220.

In an example embodiment of the present inventive concept, the first gate structure 250 may further include a first interface pattern between the first gate insulation pattern 220 and the first active pattern 105 and/or between the first gate insulation pattern 220 and the first isolation pattern 110.

The first gate insulation pattern 220 may include, for example, a metal oxide having a high dielectric constant, e.g., hafnium oxide, tantalum oxide, zirconium oxide, etc.

The first gate electrode 230 may include a metal nitride, e.g., titanium nitride, titanium aluminum nitride, tantalum nitride, tantalum aluminum nitride, etc., a metal alloy, e.g., titanium aluminum, titanium aluminum carbide, titanium aluminum oxynitride, titanium aluminum carbonitride, titanium aluminum oxycarbonitride, etc., a metal carbide, a metal oxynitride, a metal carbonitride, a metal oxycarbonitride, or a low resistance metal, e.g., tungsten, aluminum, copper, tantalum. The first capping pattern 240 may include an insulating nitride, e.g., silicon nitride.

The first gate spacer 160 may be formed on each of opposite sidewalls in the first direction D1 of the first gate structure 250, and thus, an outer sidewall of the first gate insulation pattern 220 and a sidewall of the first capping pattern 240 may be covered by an inner sidewall of the first gate spacer 160. For example, an outer sidewall of the first gate insulation pattern 220 and a sidewall of the first capping pattern 240 may contact an inner sidewall of the first gate spacer 160.

The fin spacer 170 may be formed on each of opposite sidewalk in the second direction D2 of the first active pattern 105.

The first gate spacer 160 and the fin spacer 170 may include an insulating nitride, e.g., silicon nitride (SiN), silicon oxynitride (SiON), silicon oxycarbonitride (SiOCN), etc.

The first source/drain layer 190 may be formed on a portion of the first active pattern 105 at each of opposite sides in the first direction D1 of the first gate structure 250, and may contact a lower sidewall of the first gate spacer 160 on a sidewall of the first gate structure 250.

A cross-section in the second direction D2 of the first source/drain layer 190 may have a shape, for example, of a pentagon or a rhombus. In some example embodiments of the present inventive concept, if a distance between neighboring ones of the first active patterns 105 in the second direction D2 is small, corresponding ones of the first source/drain layers 190 on the neighboring ones of the first active patterns 105, respectively, may be merged with each other.

In an example embodiment of the present inventive concept, the first source/drain layer 190 may include single crystalline silicon-germanium doped with p-type impurities, and thus may serve as a source/drain region of a p-channel metal oxide semiconductor (PMOS) transistor. In addition, the first and second source/drain layer 190 may include single crystalline silicon or single crystalline silicon carbide doped with n-type impurities, and thus may serve as a source/drain region of an n-cha metal oxide semiconductor (NMOS) transistor.

The first source/drain layer 190 may be covered by the first insulating interlayer 200. The second insulating interlayer 255 may be formed on the first insulating interlayer 200, the first capping pattern 240 and the first gate spacer 160. The third insulating interlayer 280 may be formed on the second insulating interlayer 255 and the first contact plug structure 270.

Each of the first, second and third insulating interlayers 200, 255 and 280 may include an insulating material, e.g., silicon oxycarbide (SiOC), silicon oxide ($SiO_2$), silicon nitride (SiN), silicon oxynitride (SiON), silicon carbonitride (SiCN), silicon oxycarbonitride (SiOCN), etc.

The first contact plug structure 270 may extend through the first and second insulating interlayers 200 and 255, and may contact an upper surface of the first ohmic contact pattern 262. The first contact plug structure 270 may partially extend through an upper portion of the first source/drain layer 190. Accordingly, a lowermost surface of the first contact plug structure 270 may be lower than an uppermost surface of the first source/drain layer 190.

The first contact plug structure 270 may include a first barrier pattern 264 and a first conductive structure 269 sequentially stacked in the third direction D3, and the first conductive structure 269 may include first and second conductive patterns 266 and 268 sequentially stacked in the third direction D3.

The second conductive pattern 268 may have a pillar shape or cylindrical shape extending in the third direction D3, and the first conductive pattern 266 may cover a sidewall and a lower surface of the second conductive pattern 268. For example, the second conductive pattern 268 may be disposed within the first conductive pattern 266.

Each of the first and second conductive patterns 266 and 268 may include a metal, tungsten, molybdenum, cobalt, etc. In some example embodiments of the present inventive concept, the first conductive pattern 266 might not include impurities such as boron (B) or silicon (Si), but may include a pure metal only.

In an example embodiment of the present inventive concept, the second conductive pattern 268, like the first conductive pattern 266, might not include impurities such as boron (B) or silicon (Si), but may include a pure metal only. However, the present inventive concept might not necessarily be limited thereto, and the second conductive pattern 268, unlike the first conductive pattern 266, may include impurities such as boron (B) or silicon (Si).

In some example embodiments of the present inventive concept, the first and second conductive patterns 266 and 268 may include substantially the same material as each other, and thus the first and second conductive patterns 266 and 268 may be integrally formed with each other. However, the present inventive concept might not be necessarily limited thereto, and the first and second conductive patterns 266 and 268 may include different materials from each other.

In some example embodiments of the present inventive concept, the metal included in each of the first and second conductive patterns 266 and 268 may have grains with small sizes, that is, with a maximum diameter in a range of about 8 nm to about 15 nm. Accordingly, the metal, per cross-sectional area in the first direction D1 of about 435.2 $nm^2$, may include about 25 to about 100 grains.

In some example embodiments of the present inventive concept, an upper surface of the first conductive structure 269 including the first and second conductive patterns 266 and 268 may be substantially flat at a given height.

The first barrier pattern 264 may cover a lower surface and a sidewall of the first conductive pattern 266. The first barrier pattern 264 may include a metal nitride, e.g., titanium nitride, tantalum nitride, tungsten nitride, etc. In some example embodiments of the present inventive concept, the first barrier pattern 264 may have a thin thickness equal to or less than about 10 Å.

The first ohmic contact pattern 262 may be disposed between the first source/drain layer 190 and the first contact plug structure 270, and may contact an upper surface of the first source/drain layer 190 and a lower surface of the first contact plug structure 270. The first ohmic contact pattern 262 may include a silicide of a metal, e.g., cobalt, titanium, nickel, etc.

In some example embodiments of the present inventive concept, a thickness of the first ohmic contact pattern 262 may, be substantially constant. However, the present inventive concept is not necessarily limited thereto.

In some example embodiments of the present inventive concept, the second contact plug 290 may extend through the first capping pattern 240 and the second and third insulating interlayers 255 and 280, and may contact an upper surface of the first gate electrode 230. The first via 295 may extend through the third insulating interlayer 280, and may contact an upper surface of the first contact plug structure 270.

The second contact plug 290 may include a conductive material, e.g., a metal, a metal nitride, a metal silicide. In an example embodiment of the present inventive concept, the second contact plug 290 may have a structure substantially the same as a structure of the first contact plug structure 270, so that the second contact plug 290 may include a barrier pattern including a metal nitride and first and second contact patterns containing a metal.

Vias and wirings that may apply electrical signals to the second contact plug 290 and the first via 295 may be formed thereon.

The semiconductor device may include the first gate structure 250, which is on the first active pattern 105 that serves as a channel, and the first source/drain layers 190, which are on portions of the first active pattern 105 that is adjacent to the first gate structure 250. Thus, the semiconductor device may include a finFET.

In the semiconductor device, the first contact plug structure 270 may include the first conductive structure 269 which has the first and second conductive patterns 266 and 268, and the first barrier pattern 264 covering the lower surface and the sidewall of the first conductive structure 269.

As described below, the first conductive pattern 266 may be formed by a PVD process instead of a CVD process which may use a reactive source gas, and thus, the first barrier pattern 264 may have a thin thickness equal to or less than about 10 Å.

The first barrier pattern 264 including a metal nitride may have a relatively greater resistance than that of the first conductive structure 269 including a metal. However, the first barrier pattern 264 may be thinner than the first conductive structure 269, so that a volume occupied by the first barrier pattern 264 within the first contact plug structure 270 may be reduced, Thus, the total resistance of the first contact plug structure 270 may be decreased.

In addition, as described below, a CVD process for forming the first conductive pattern 266 may be performed by using, e.g., $H_2$ instead of $B_2H_6$ or $SiH_4$, and thus, the first conductive pattern 266 might not necessarily include impurities such as boron (B) or silicon (Si). Accordingly, the first conductive pattern 266 may include a pure metal, and thus, the first conductive pattern 266 may have a low resistance. In some example embodiments of the present inventive concept, as described above, if the second conductive pattern 268 does not include impurities like the first conductive pattern 266, the second conductive pattern 268 may also have a low resistance. Accordingly, the total resistance of the first contact plug structure 270 including the first and second conductive patterns 266 and 268 may be further reduced.

If the first contact plug structure 270 does not include the first barrier pattern 264, grains of the metal included in the first conductive structure 269 may have large sizes, and thus, the metal included in the first conductive structure 269 may include a small number of grains (e.g., less than about 5). Accordingly, as described below, when a planarization process of the first and second conductive layers 265 and 267 (refer to FIGS. 19 and 20) is performed to form the first and second conductive patterns 266 and 268, respectively, upper surfaces of the first and second conductive patterns 266 and 268 might not be flat, due to the difference in the removal rate of the first and second conductive patterns 266 and 268.

However, in some example embodiments of the present inventive concept, the first contact plug structure 270 may include the first barrier pattern 264, and grains of the metal included in the first conductive structure 269 may have small sizes due to the influence of the first barrier pattern 264. Thus, a large number of metal crystal grains may be formed in the first conductive structure 269, and accordingly, the upper surfaces of the first and second conductive patterns 266 and 268 may be substantially coplanar at a given height from the upper surface of the substrate 100 so that the first conductive structure 269 may have a substantially flat upper surface.

FIGS. 5 to 20 are plan views and cross-sectional views illustrating a method of manufacturing a semiconductor device in accordance with example embodiments of the present inventive concept. Particularly, FIGS. 5, 8, 12 and 15 are the plan views, and FIGS. 6-7, 9-11, 13-14 and 16-20 are the cross-sectional views.

Figure 6:
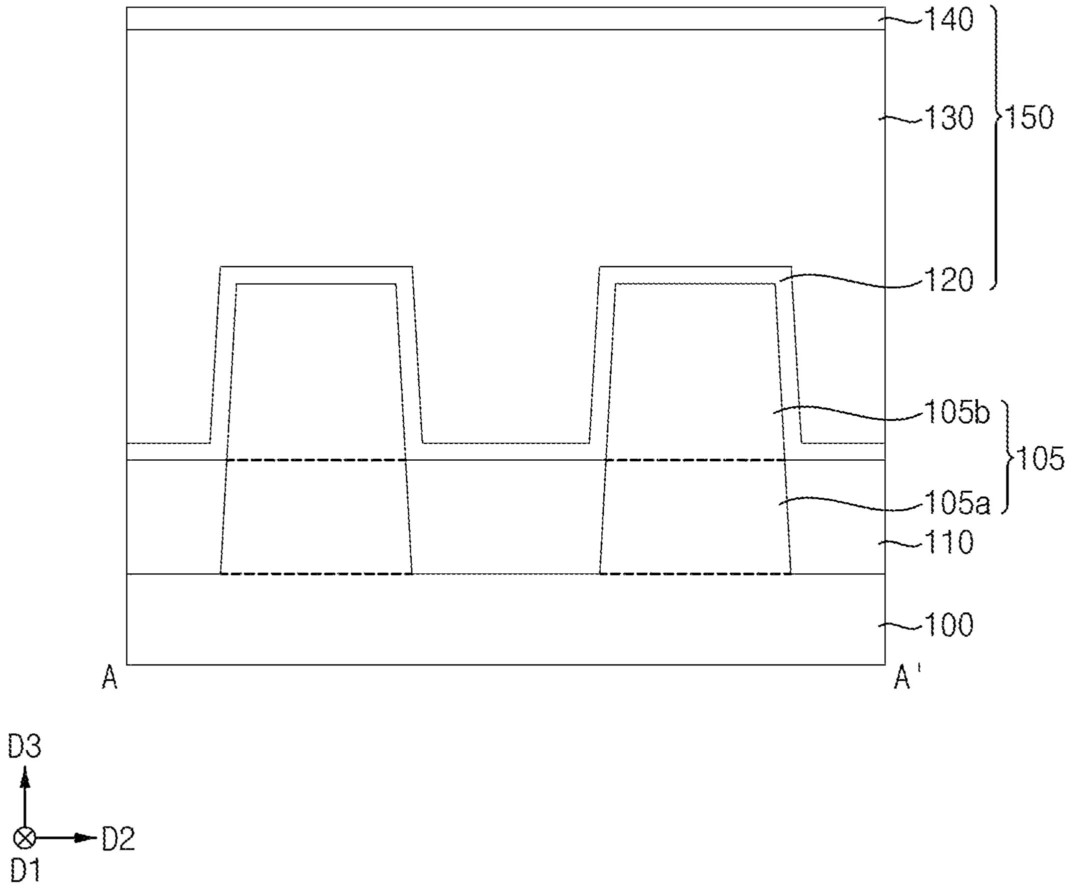
Figure 9:
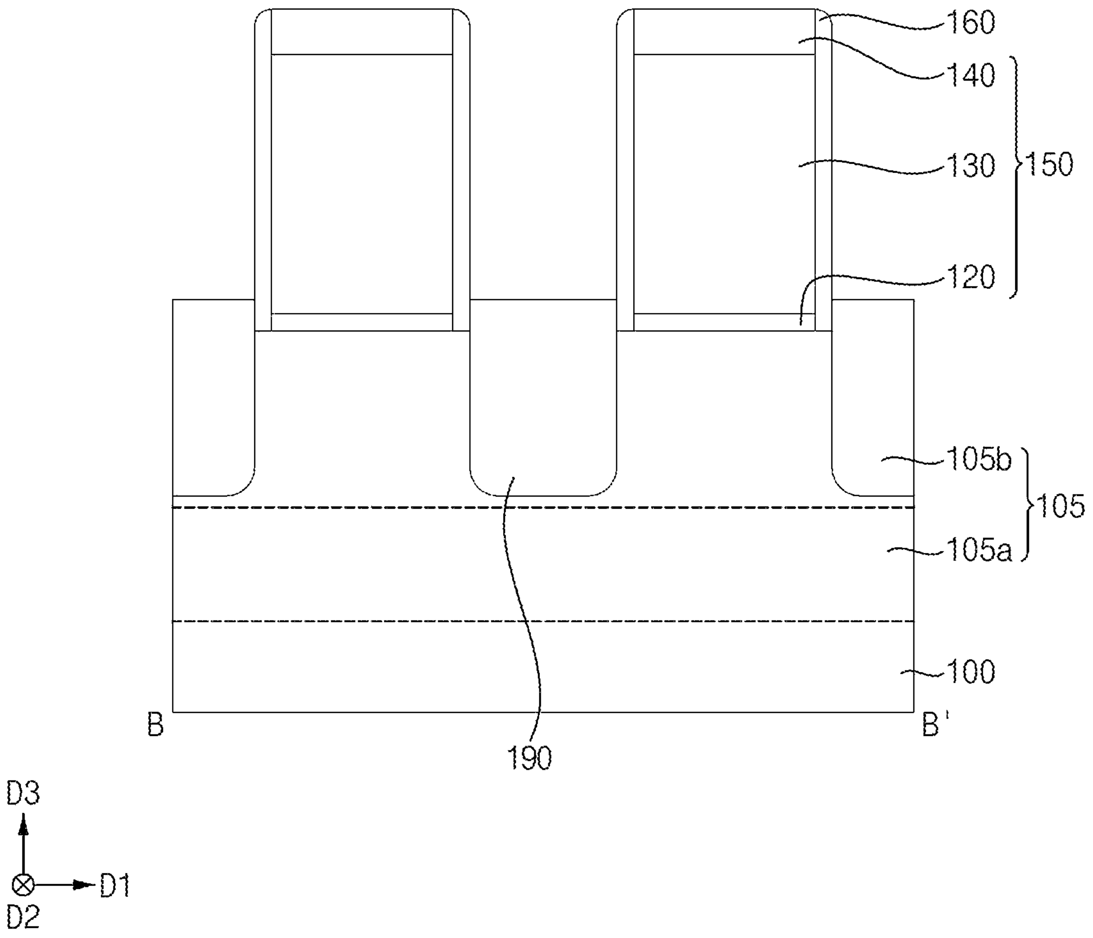
Figure 10:
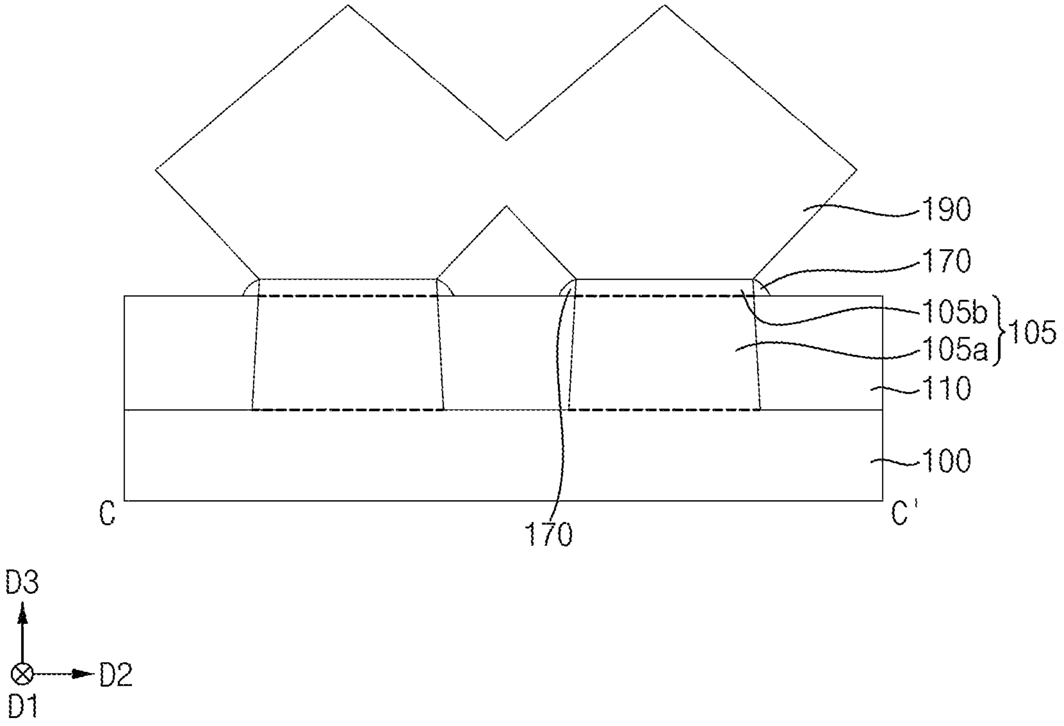
Figure 13:
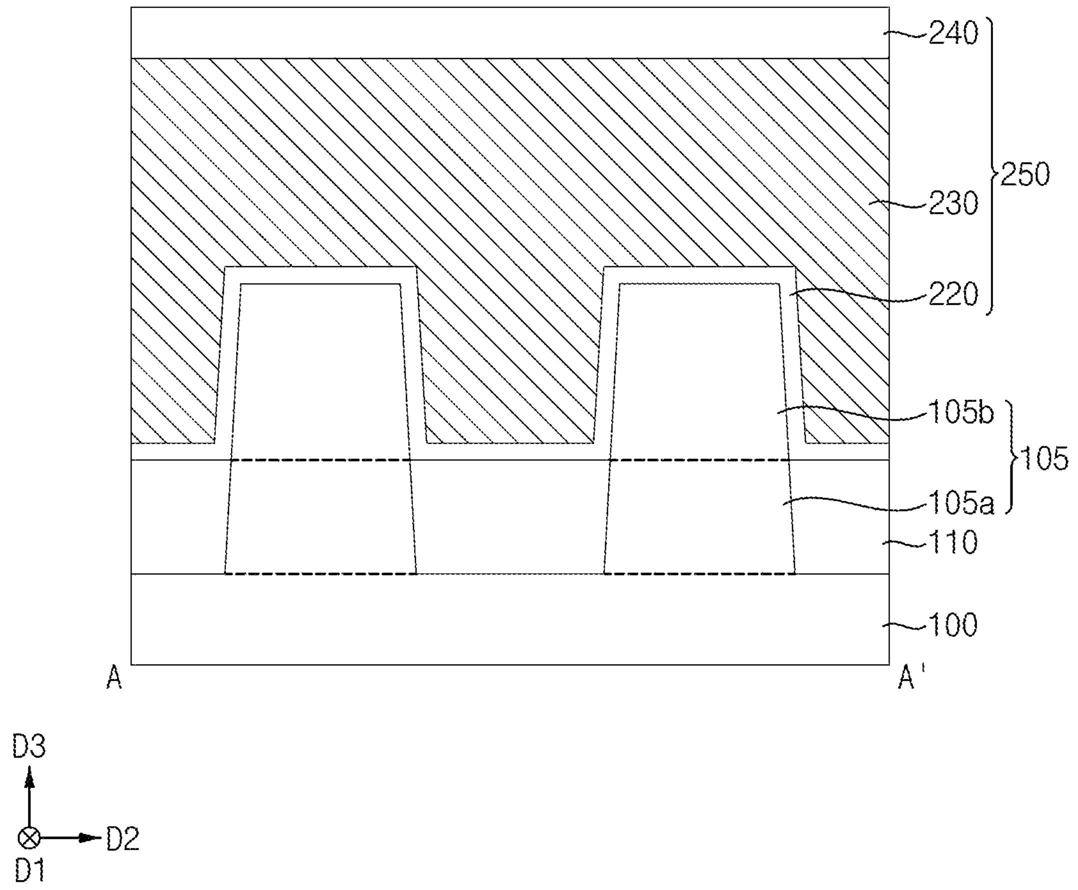

FIGS. 6 and 13 are cross-sectional views taken along lines A-A' of corresponding plan views, respectively, FIGS. 7, 9, 11, 14 are 16-20 are cross-sectional views taken along lines B-B' of corresponding plan views, respectively, and FIG. 10 is a cross-sectional view taken along line C-C' of a corresponding plan view.

Figure 5:
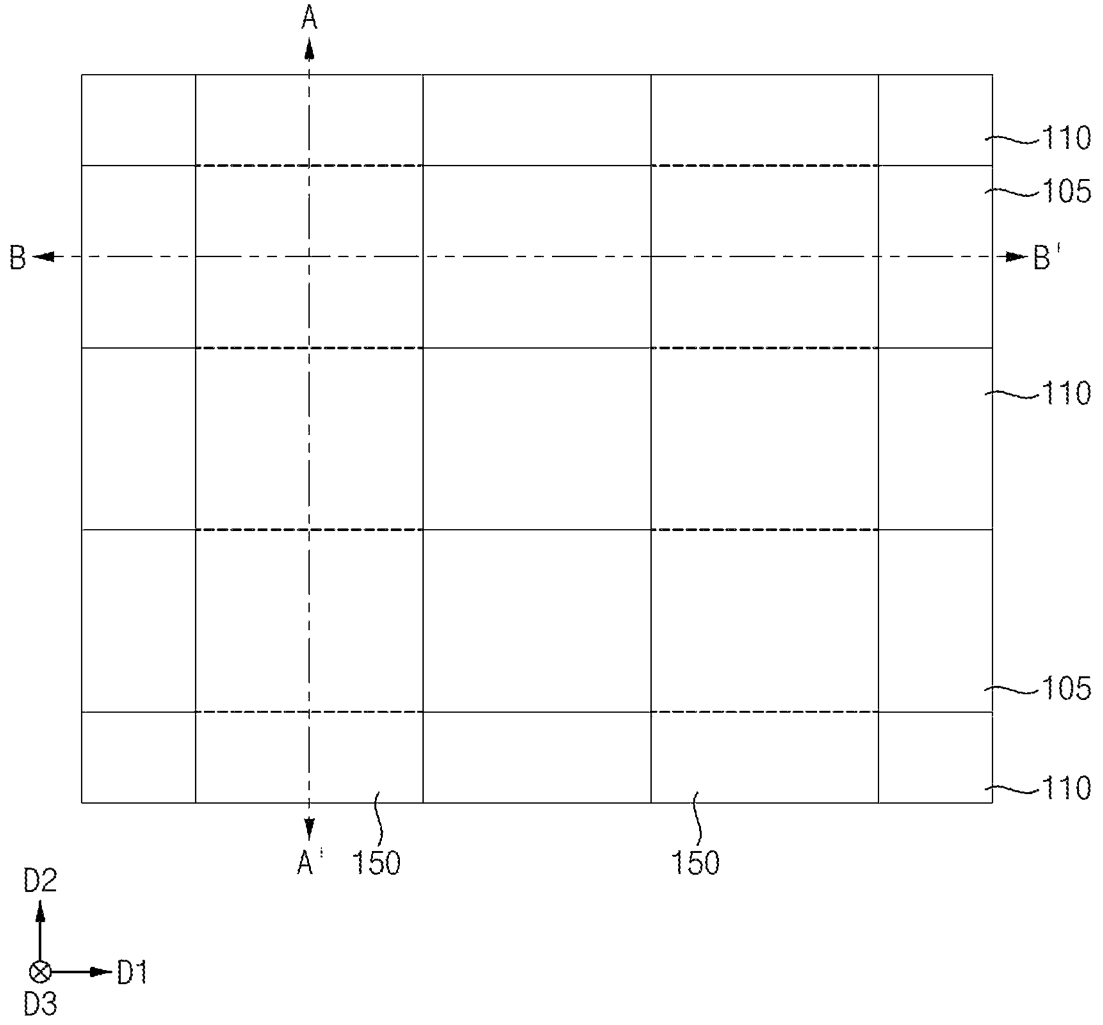
FIGS. 5, 6, 7, 8, 9, 10, 11, 12, 13, 14, 15, 16, 17, 18, 19 and 20 are plan views and cross-sectional views illustrating a method of manufacturing a semiconductor device in accordance with example embodiments of the present inventive concept.
Figure 7:
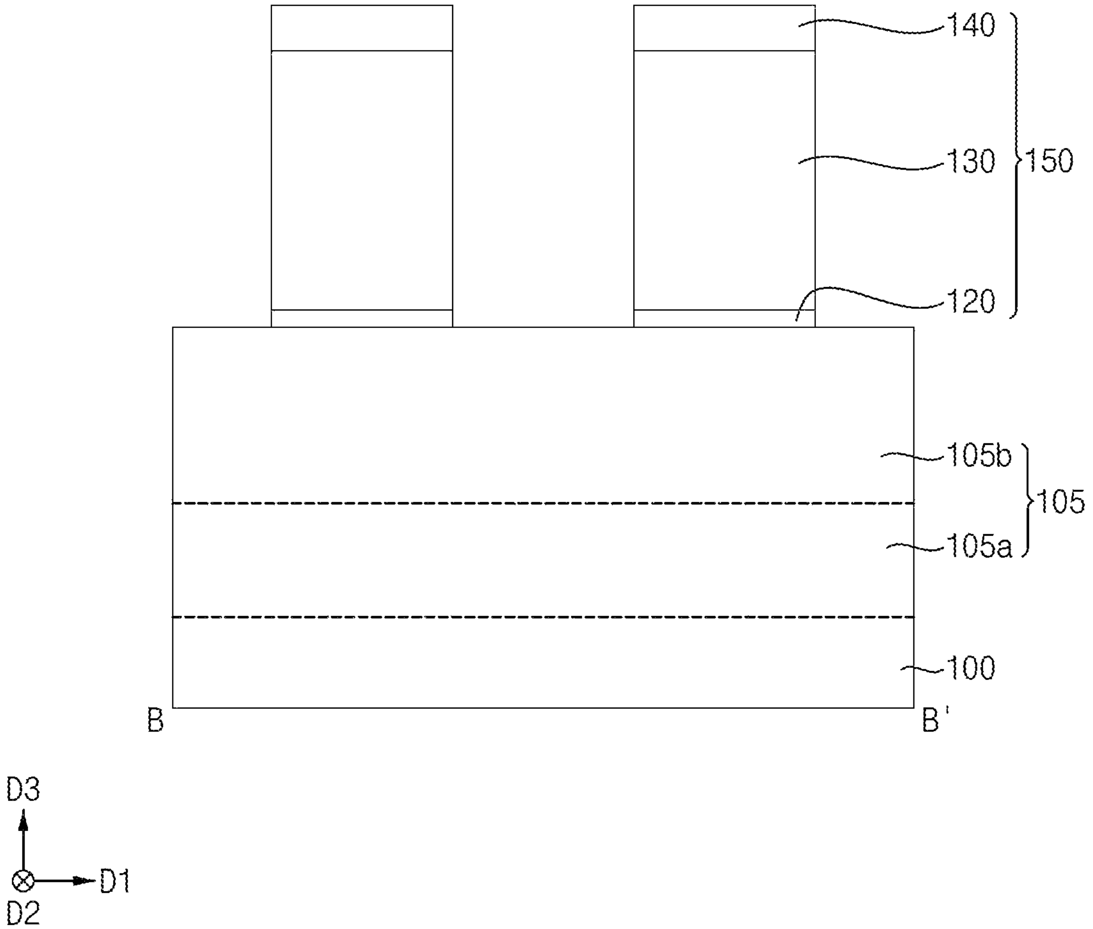

Referring to FIGS. 5 to 7, an upper portion of a substrate 100 may be removed to form a first trench to define a first active pattern 105 on the substrate 100, and a first isolation pattern 110 may be formed in a lower portion of the first trench.

In some example embodiments of the present inventive concept, the first isolation pattern 110 may be formed by forming a first isolation layer on the substrate 100 to fill the first trench, planarizing the first isolation layer until an upper surface of the substrate 100 is exposed, and removing an upper portion of the first isolation layer to expose an upper portion of the first trench.

The planarization process may include, e.g., a chemical mechanical polishing (CMP) process and/or an etch back process.

In some example embodiments of the present inventive concept, the first active pattern 105 may extend in the first direction D1, and a plurality of first active patterns 105 may be spaced apart from each other in the second direction D2.

A first dummy gate structure 150 may be formed on the first active pattern 105 and the first isolation pattern 110. The first dummy gate structure 150 may include a first dummy gate insulation pattern 120, a first dummy gate electrode 130 and a first dummy gate mask 140 sequentially stacked on the substrate 100.

The first dummy gate insulation pattern 120 may include an oxide, e.g., silicon oxide. The first dummy gate electrode 130 may include, e.g., polysilicon, and the first dummy gate mask 140 may include an insulating nitride, silicon nitride.

In some example embodiments of the present inventive concept, the first dummy gate structures 150 may extend in the second direction D2. A plurality of first dummy gate structures 150 may be spaced apart from each other in the first direction D1.

Figure 8:
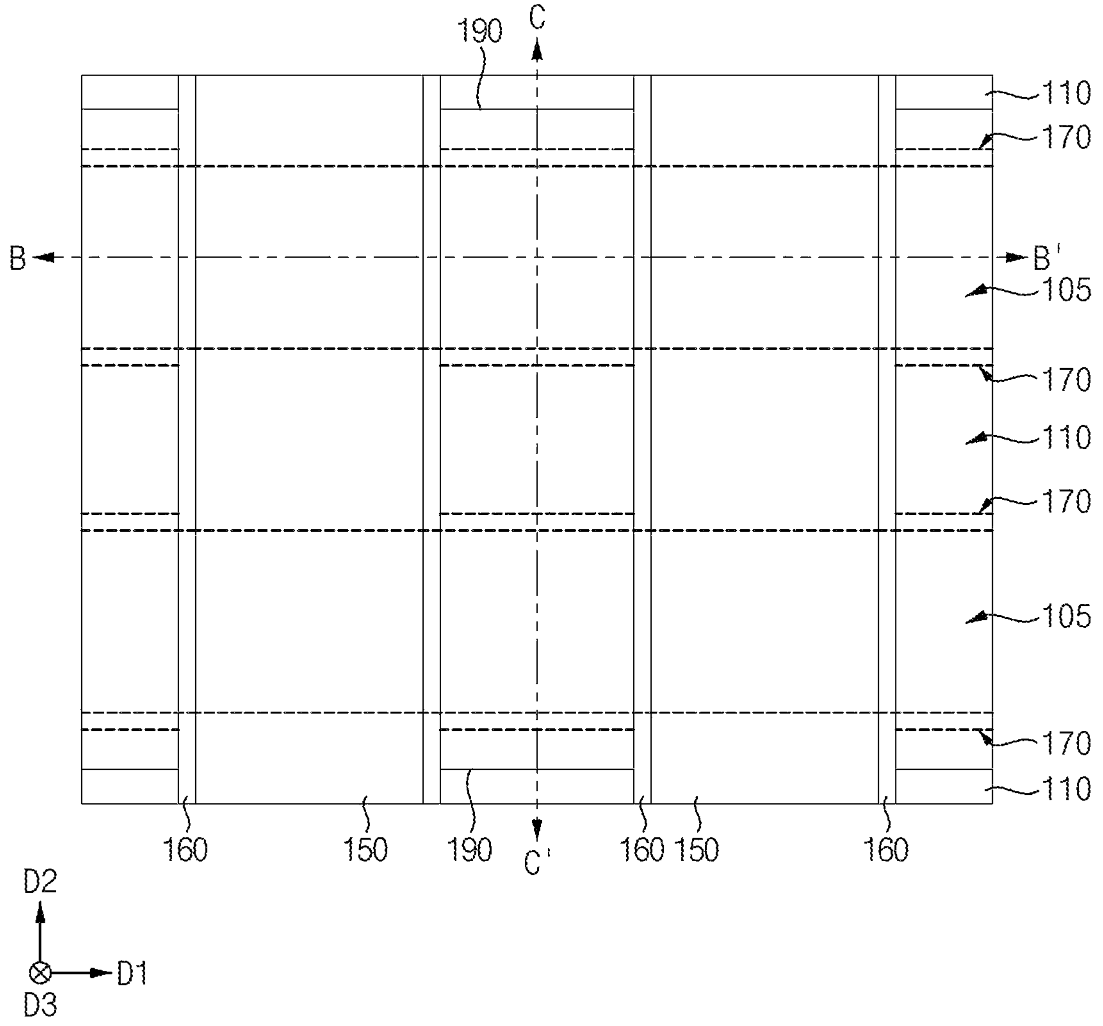

Referring to FIGS. 8 to 10, a first gate spacer 160 may be formed on each of opposite sidewalls in the first direction D1 of the first dummy gate structure 150. Additionally, a fin spacer 170 may be formed on each of opposite sidewalls in the second direction D2 of the first active pattern 105.

The first gate spacer 160 and the fin spacer 170 may be formed by forming a first spacer layer on the first active pattern 105, the first isolation pattern 110 and the first dummy gate structures 150, and anisotropically etching the first spacer layer. The first gate spacer 160 and the fin spacer 170 may include an insulating nitride, e.g., silicon nitride (SiN), silicon oxynitride (SiON), silicon oxycarbonitride (SiOCN), etc.

Upper portions of the first active pattern 105 may be etched using the first dummy gate structure 150 and the first gate spacer 160 as an etching mask to form a first recess.

FIG. 9 shows that the first recess is formed by partially removing the first upper active pattern 105*b*, however, the present inventive concept might not necessarily be limited thereto, and each of the first recess may be formed by partially removing the first lower active pattern 105*a* as well as the first upper active pattern 1051).

The anisotropic, etching process of the first spacer layer and the etching process for forming the first recess may be performed in-situ.

A selective epitaxial growth (SEG) process may be performed by using an upper surface of the first active pattern 105 exposed by the first recess as a seed to form a first source/drain layer 190 on the first active pattern 105.

The SEG process may be performed using a silicon source gas, e.g., dichlorosilane ($SiH_2Cl_2$) gas, a germanium source gas, e.g., germane ($GeH_4$) gas to form a single-crystal silicon-germanium (SiGe) layer. A single crystalline silicon-germanium layer doped with p-type impurities may be formed as the first source/drain layer 190 by using a p-type impurity source gas, e.g., diborane ($B_2H_6$) gas together with the silicon source gas and the germanium source gas.

In addition, the SEG process may be performed using a silicon source gas, e.g., disilane ($Si_7H_6$) gas and a carbon source gas, e.g., $SiH_3CH_3$ gas as a source gas to form a single crystal silicon carbide (SiC) layer. A single crystalline silicon carbide layer doped with n-type impurities may be formed as the first source/drain layer 190 by using an n-type impurity source gas, e.g., $PH_3$ together with the silicon source gas. In addition, the SEG process may be performed using only the silicon source, e.g., disilane ($Si_2H_6$) gas as the source gas and the n-type impurity source gas to form a single crystalline silicon layer doped with n-type impurities.

The first source/drain layer 190 may fill the first recess, and may further grow to contact a lower sidewall of the first gate spacer 160. The first source/drain layer 190 may grow in the horizontal direction as well as in the vertical direction, to have a cross-section taken along the second direction D2 having a shape of a pentagon or a rhombus. If a distance between ones of the first active patterns 105 neighboring in the second direction D2 is small, corresponding ones of the first source/drain layers 190 grown from upper surfaces of the neighboring ones of the first active patterns 105, respectively, may be merged with each other.

Figure 11:
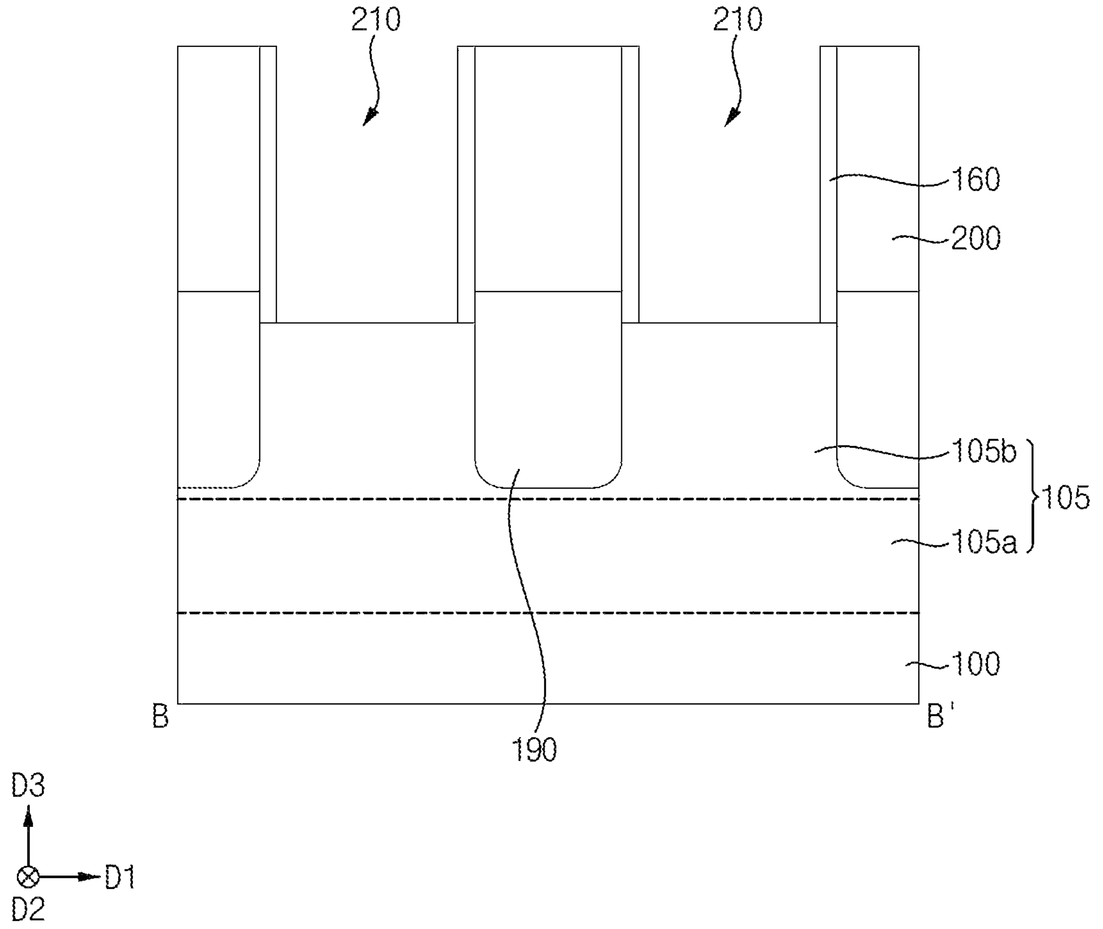

Referring to FIG. 11, a first insulating interlayer 200 may be formed on the first dummy gate structure 150, the first gate spacer 160, the fin spacer 170, the first source/drain layer 190 and the first isolation pattern 110 and may have an upper surface higher than upper surfaces of the first dummy gate structure 150 and the first gate spacer 160.

A planarization process may be performed until an upper surface of the first dummy gate electrode 130 included in the first dummy gate structure 150 is exposed to remove an upper portion of the first insulating interlayer 200 and the first dummy gate mask 140, which is included in the first dummy gate structure 150, and an upper portion of the first gate spacer 160 may also be removed.

The first dummy gate electrode 130 and the first dummy gate insulation pattern 120 may be removed to form a first opening 210, which may expose upper surfaces of the first active pattern 105 and the first isolation pattern 110.

In some example embodiments of the present inventive concept, the first dummy gate electrode 130 and the first dummy gate insulation pattern 120 may be removed by sequentially performing a dry etching process and a wet etching process. The wet etching process may be performed using, e.g., hydrofluoric acid (HF) as an etching solution.

Figure 12:
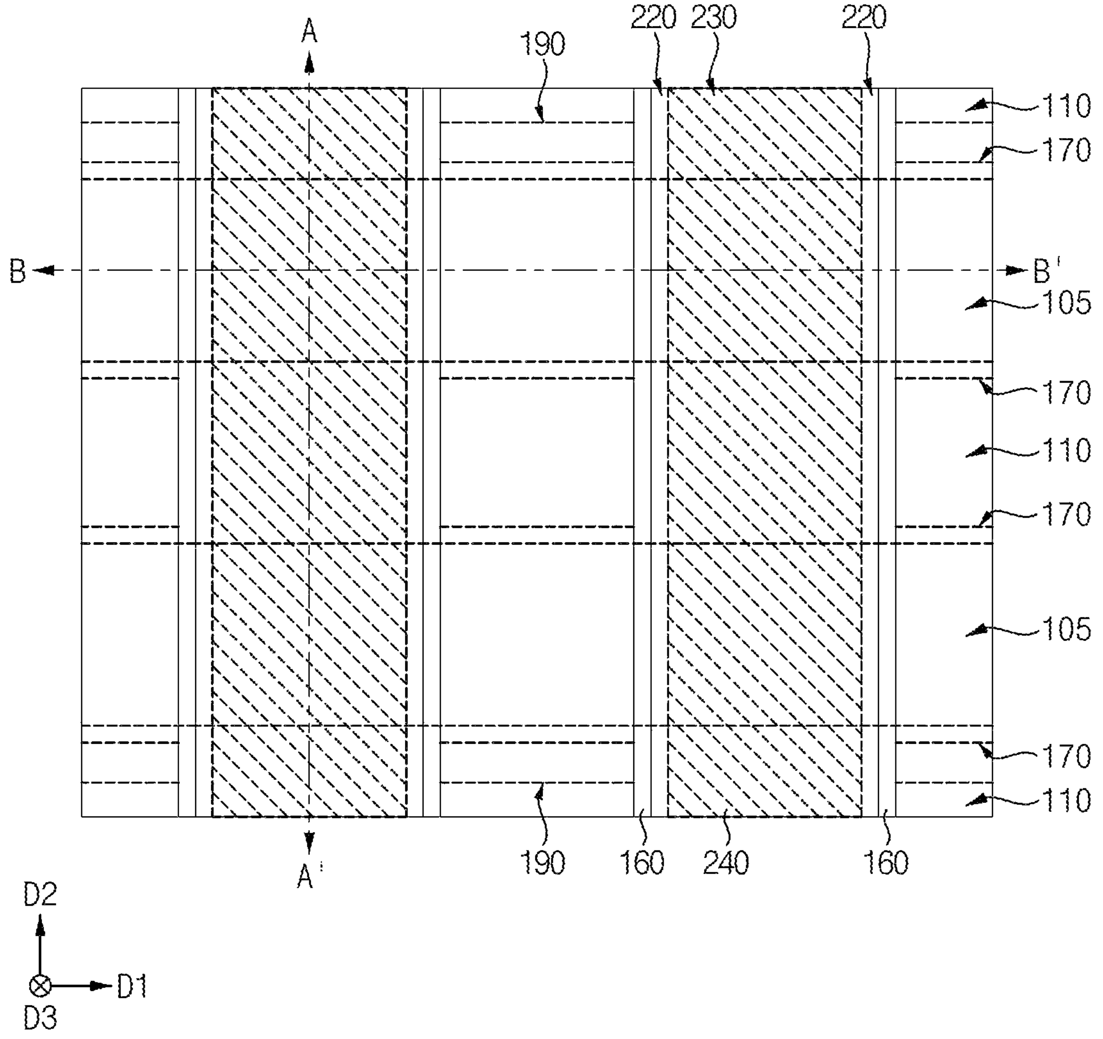
Figure 14:
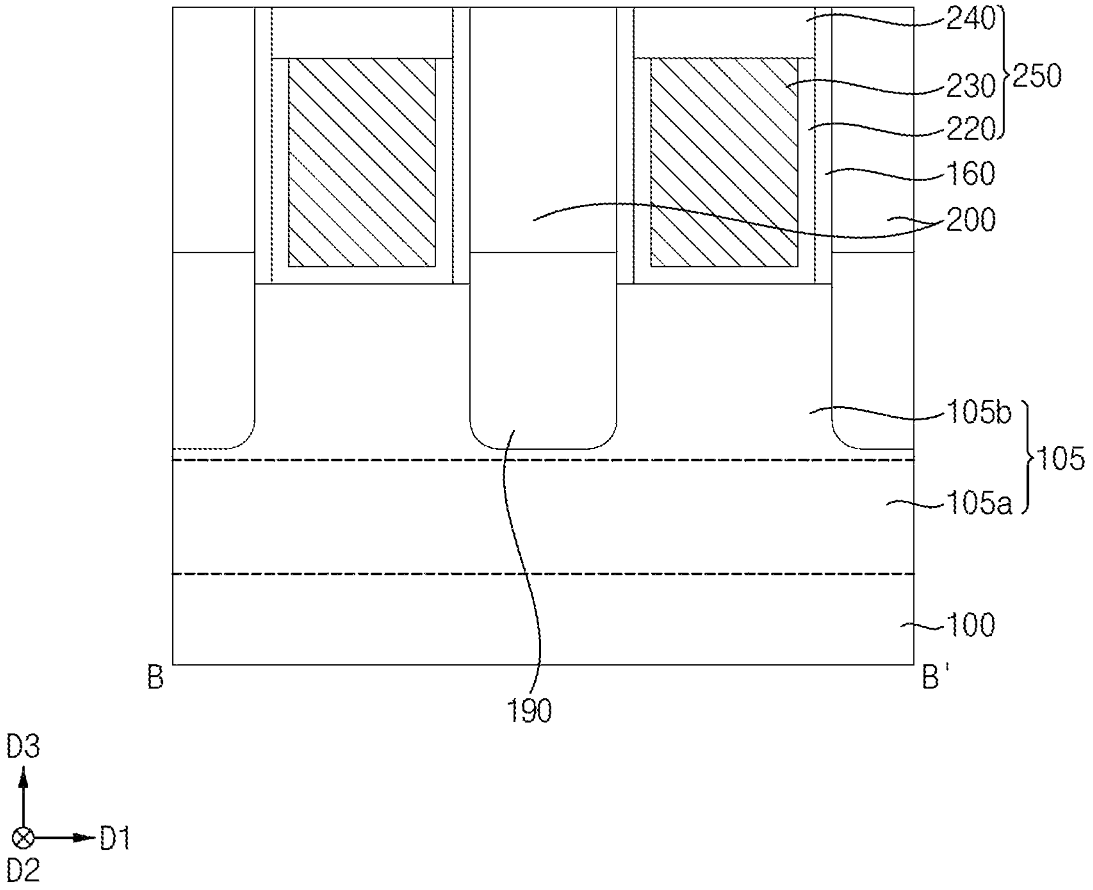

Referring to FIGS. 12 to 14, a first gate insulation layer may be formed on a bottom and a sidewall of the first opening 210 and an upper surface of the first insulating interlayer 200. A first gate electrode layer may be formed on the first gate insulation layer to fill a remaining portion of the first opening 210, and the first gate electrode layer and the first gate insulation layer may be planarized until the upper surface of the first insulating interlayer 200 is exposed.

Thus, a first gate electrode 230 and a first gate insulation pattern 220 covering a lower surface and a sidewall of the first gate electrode 230 may be formed in the first opening 210.

In an example embodiment of the present inventive concept, the first gate electrode layer may include a barrier layer and a gate conductive layer, and in this case, the first gate electrode 230 may include a barrier pattern and a gate conductive pattern.

Upper portions of the first gate electrode 230 and the first gate insulation pattern 220 may be removed to form a second recess, and a first capping pattern 240 may be formed in the second recess.

Thus, a first gate structure 250 including the first gate insulation pattern 220, which is on the upper surfaces of the first active pattern 105 and the first isolation pattern 110 and on a lower inner sidewall of the first gate spacer 160, the first gate electrode 230, which is on the first gate insulation pattern 220 in a lower portion of the first opening 210, and the first capping pattern 240, which is on the first gate insulation pattern 220 and the first gate electrode 230 in an upper portion of the first opening 210 and contacts an upper inner sidewall of the first gate spacer 160, may be formed in the first opening 210.

Figure 15:
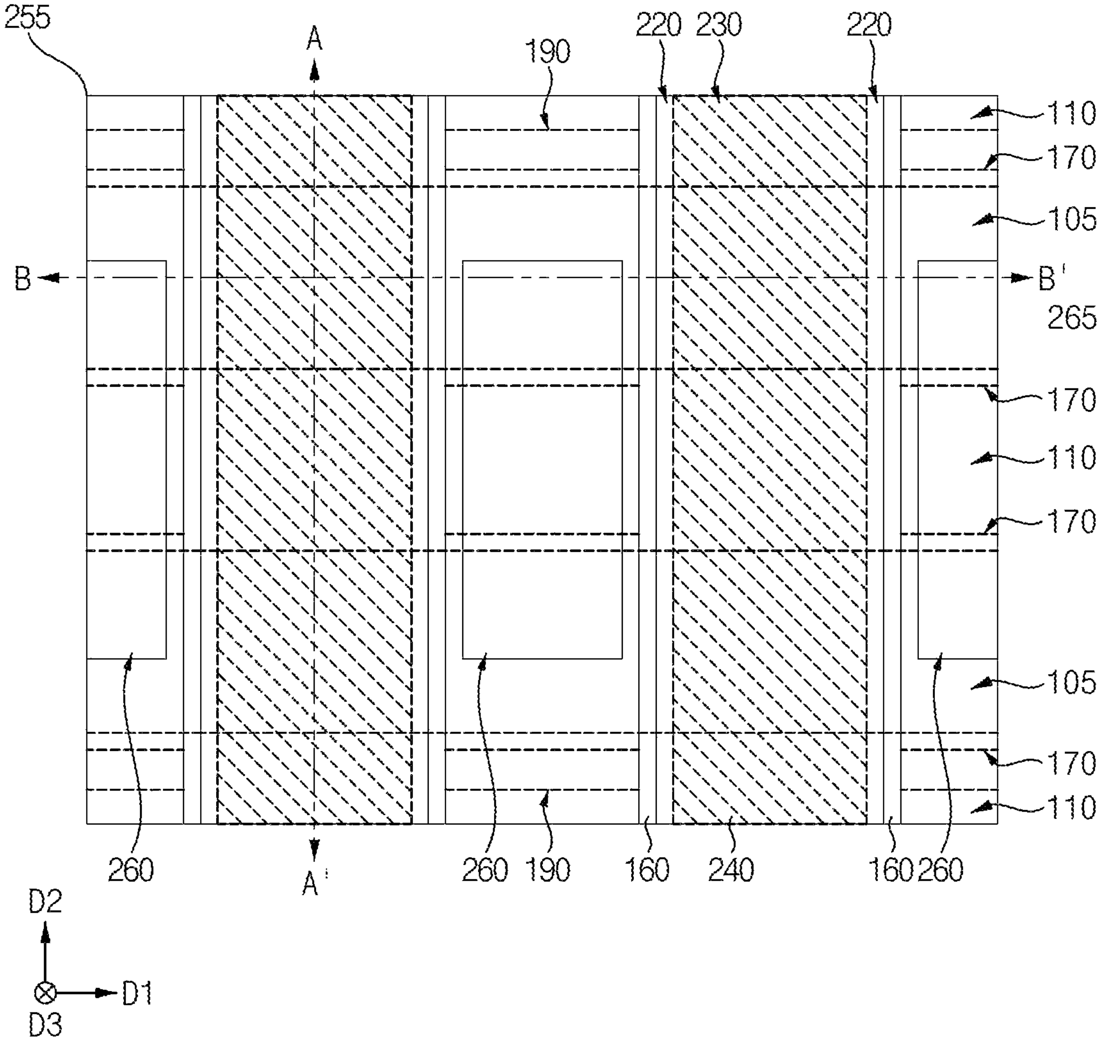
Figure 16:
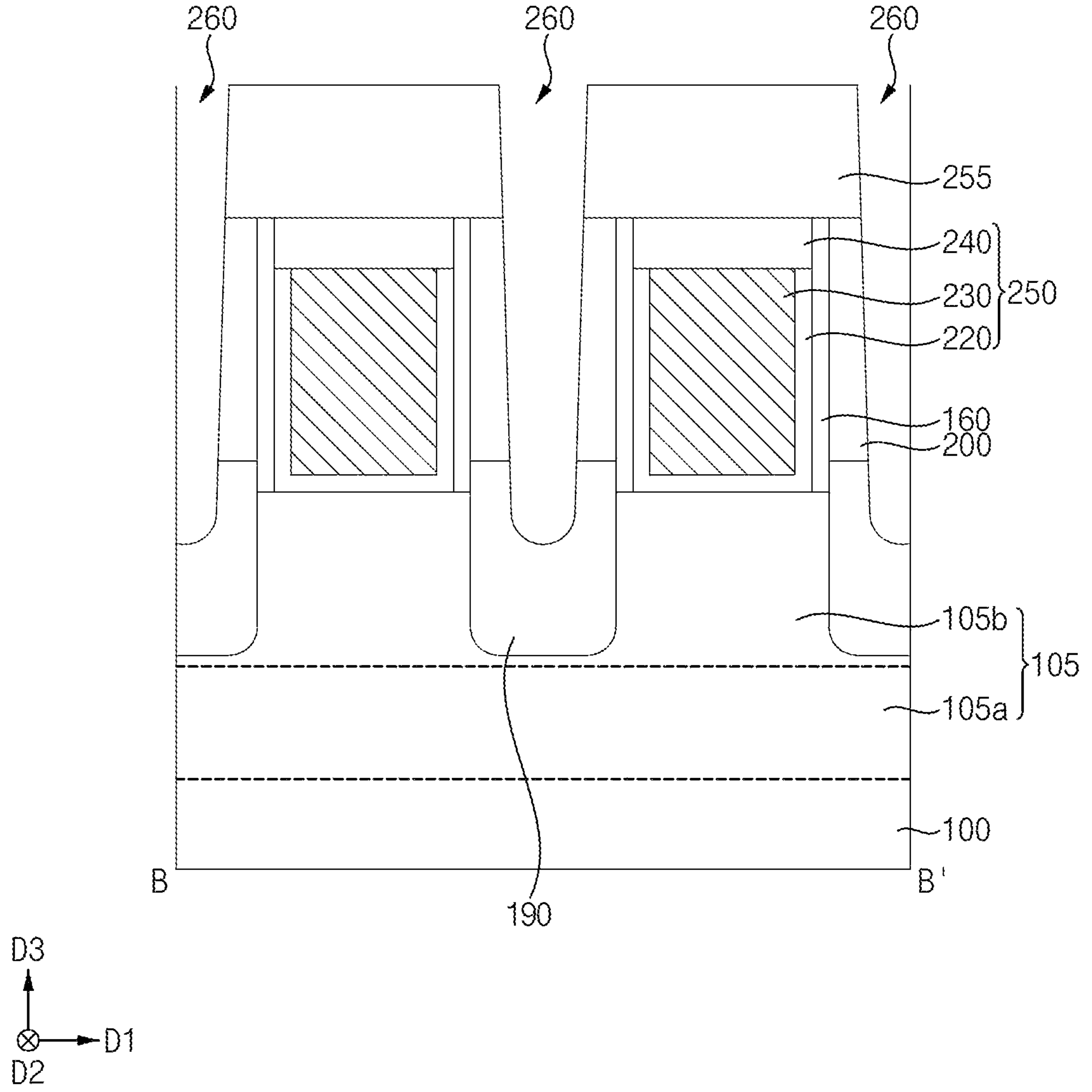

Referring to FIGS. 15 and 16, a second insulating interlayer 255 may be formed on the first capping pattern 240, the first gate spacer 160 and the first insulating interlayer 200, and the first and second insulating interlayers 200 and 255 may be partially removed to form a second opening 260 exposing an upper surface of the first source/drain layer 190. The second opening 260 may partially extend through an upper portion of the first source/drain layer 190.

Figure 17:
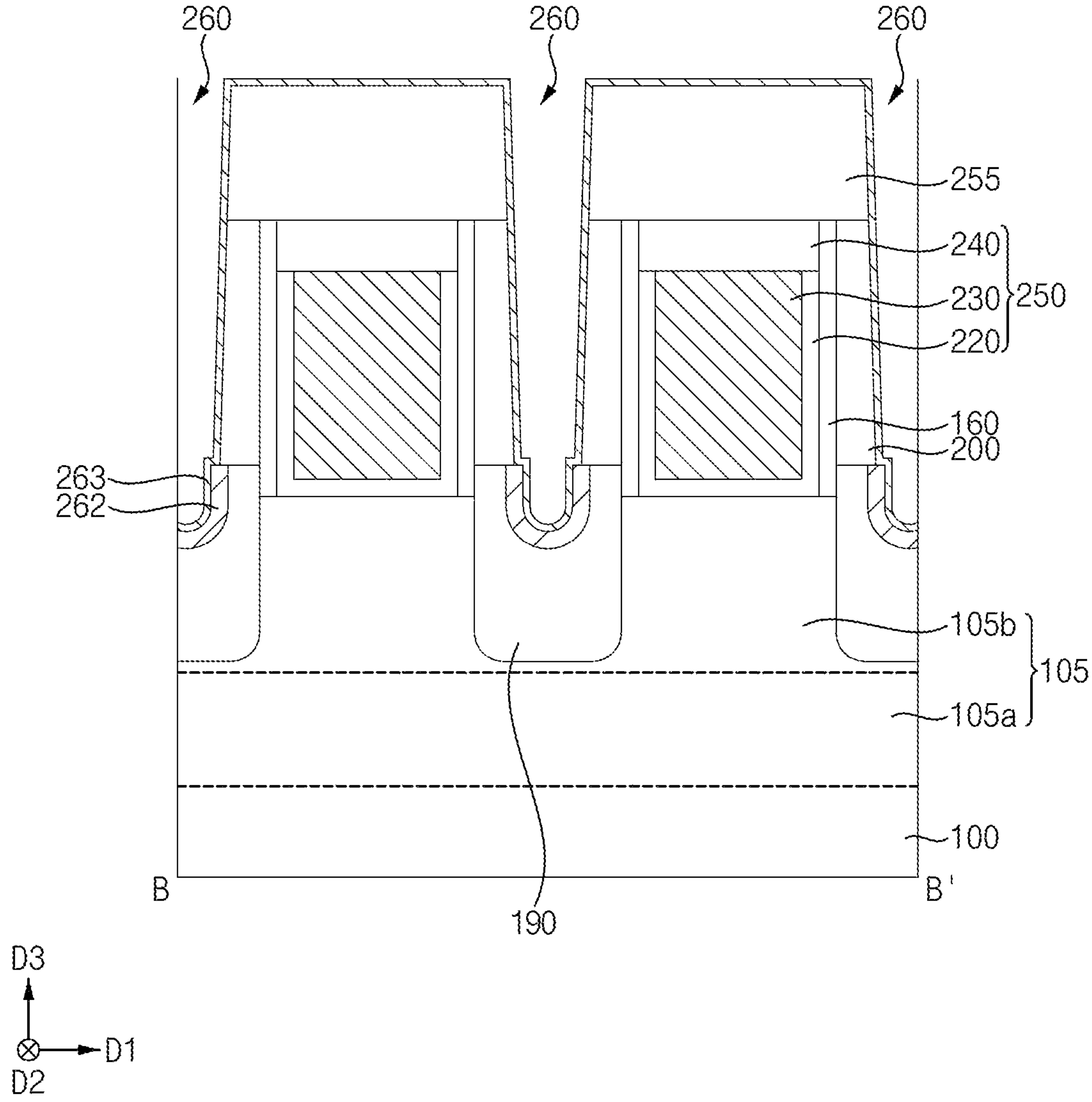

Referring to FIG. 17, a first ohmic contact pattern 262 may be formed on the upper surface of the first source/drain layer 190 that is exposed by the second opening 260.

In some example embodiments of the present inventive concept, the first ohmic contact pattern 262 may be formed by a silicidation process. For example, a first metal layer may be formed on the upper surface of the first source/drain layer 190, which is exposed by the second opening 260, a sidewall of the second opening 260 and an upper surface of the second insulating interlayer 255. A heat treatment process may be performed on the first metal layer, and accordingly, silicon included in the first source/drain layer 190 and a metal included in the first metal layer may react with each other to form the first ohmic contact pattern 262 which may include a metal silicide.

In an example embodiment of the present inventive concept, a thickness the first ohmic contact pattern 262 may be substantially constant.

A first barrier layer 263 may be formed on the first ohmic contact pattern 262, the sidewall of the second opening 260 and the upper surface of the second insulating interlayer 255 by, e.g., a CND process. The first barrier layer 263 may include a metal nitride, e.g., titanium nitride, tantalum nitride, tungsten nitride, etc. In some example embodiments of the present inventive concept, the first barrier layer 263 may be formed to have a thin thickness equal to or less than about 10 Å.

Figure 18:
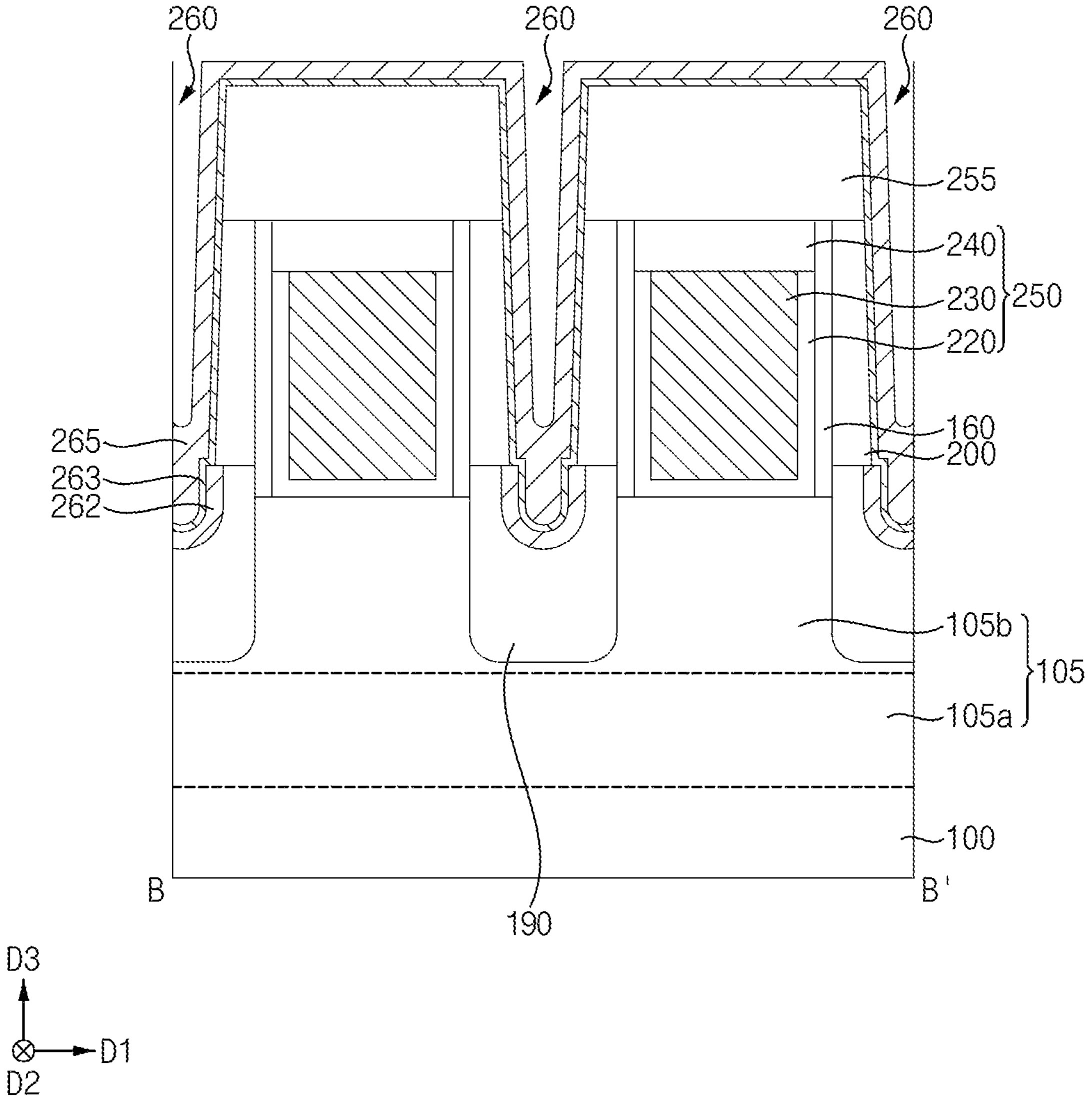

Referring to FIG. 18, a first conductive layer 265 may be formed on the first barrier layer 263.

In some example embodiments of the present inventive concept, the first conductive layer 265 may be formed by a PVD process, and may include a metal, e.g., tungsten, molybdenum, cobalt, etc.

In an example embodiment of the present inventive concept, the first conductive layer 265 may include tungsten. The first conductive layer 265 may be formed by a PVD process, instead of a CVD process in which a source gas, e.g., $WF_6$ or $WCl_6$, and a reduction gas, e.g., $B_2H_6$ or $SiH_4$ are used. Accordingly, the first conductive pattern 266 may include a pure metal only, and may have a relatively low resistance.

The first conductive layer 265 may be formed to contact an upper surface of the first barrier layer 263. Hence, the first conductive layer 265 may be affected by a material included in the first barrier layer 263, titanium nitride, so as to have grains with small sizes.

As described below, a second conductive layer 267 (refer to FIG. 19) may be formed by a CVD process using a source gas, e.g., $WF_6$ or $WCl_6$. Thus, the first conductive layer 265 may be formed to have a relatively large thickness to prevent $WF_6$ or $WCl_6$, which are highly reactive, from reacting with a surrounding material (e.g., silicon).

Figure 19:
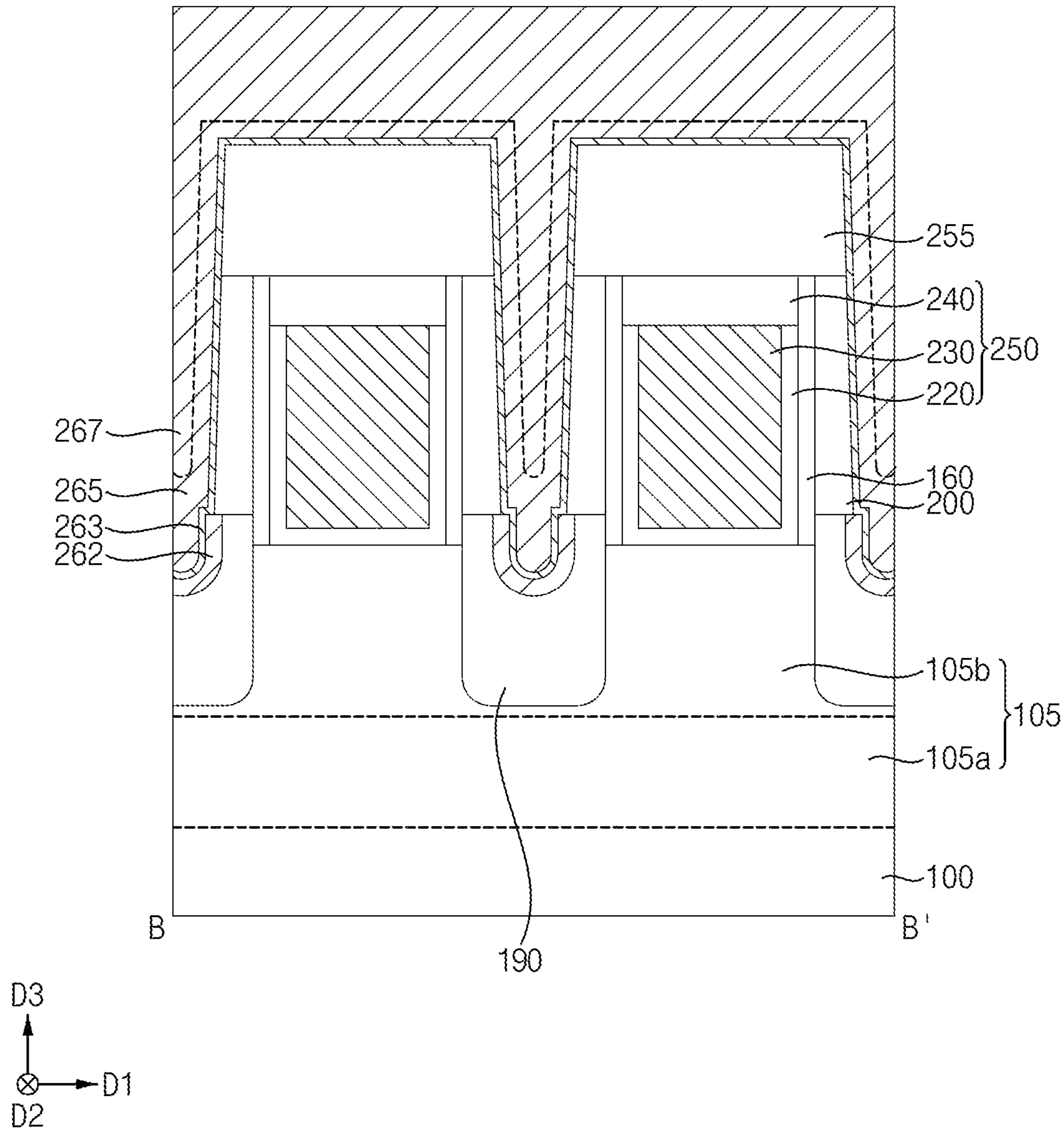

Referring to FIG. 19, a second conductive layer 267 may be formed on the first conductive layer 265 to fill a remaining portion of the second opening 260.

In some example embodiments of the present inventive concept, the second conductive layer 267 may be formed by a CVD process, and may include a metal, e.g., tungsten, molybdenum, cobalt, etc.

In an example embodiment of the present inventive concept, the second conductive layer 267 may be formed to include tungsten, and in this case, the second conductive layer 267 may be formed by a CVD process using a source gas, e.g., $WF_6$ or $WCl_6$ and a reduction gas, e.g., $H_2$. Accordingly, the second conductive pattern 268 might not include impurities such as boron (B) or silicon (Si) so as to include a pure metal such as tungsten, and thus may have a low resistance.

In an example embodiment of the present inventive concept, the second conductive layer 267 may be formed by a CVD process using a source gas, e.g., $WF_6$ or $WCl_6$ and a reduction gas, e.g., $B_2H_6$ or $SiH_4$. In this case, the second conductive pattern 268 may include, unlike the first conductive pattern 266, impurities such as boron (B) or silicon (Si).

The CVD process may be performed by using the first conductive layer 265 as a seed, and accordingly, the second conductive layer 267 may grow to have a crystallinity substantially the same as that of the first conductive layer 265. In this case, the first and second conductive layers 265 and 267 may include the same metal, e.g., tungsten, and thus, the first and second conductive layers 265 and 267 may be integrally formed with each other.

As described above, the metal included in the first conductive layer 265 may include have small grains due to the influence of the material included in the first harder layer 263, and thus, the second conductive layer 267, which may be formed to have the crystallinity substantially the same as that of the first conductive layer 265, may also include a metal having small grains.

Figure 20:
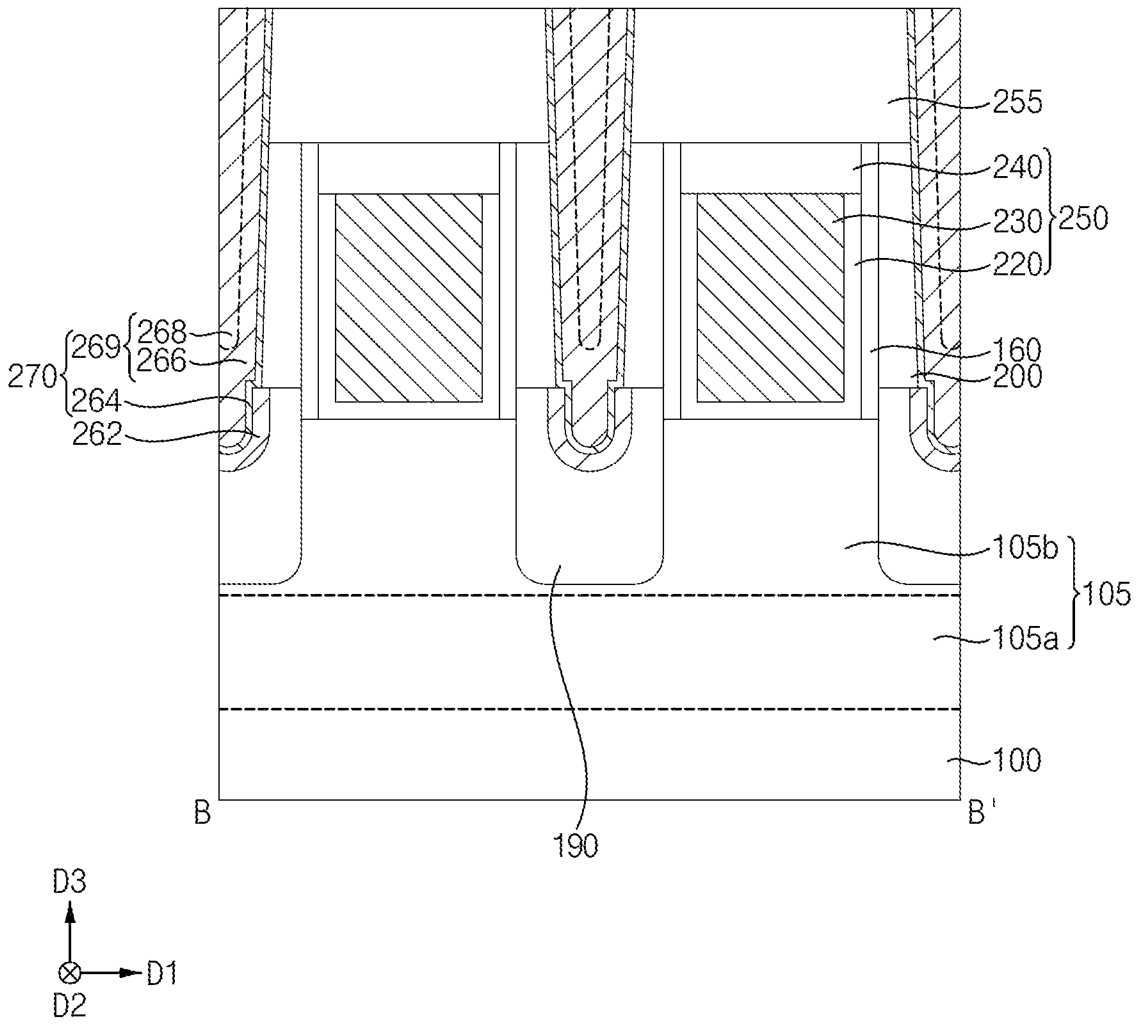

Referring to FIG. 20, a planarization process may be performed on the first barrier layer 263 and the first and second conductive layers 265 and 267 to form a first barrier pattern 264 and first and second conductive patterns 266 and 268, respectively. The first and second conductive patterns 266 and 268 may collectively form a first conductive structure 269.

The planarization process may include, e.g., a chemical mechanical polishing (CMP) process and/or and etch back process. During the planarization process, grains of the metal included in the first and second conductive layers 265 and 267 are relatively small, and thus, the difference in the removal rate of the first and second conductive layers 265 and 267 may be small. Accordingly, upper surfaces of the first and second conductive patterns 266 and 268 may be substantially coplanar with each other, and the first conductive structure 269 including the first and second conductive patterns 266 and 268 may be substantially flat at a given height from the upper surface of the substrate 100.

In an example embodiment of the present inventive concept, the metal included in the first conductive structure 269 may include about 25 to about 100 grains per cross-sectional area in the first direction D1 of about 435.2 $nm^2$.

Referring to FIGS. 1 to 4 again, a third insulating interlayer 280 may be formed on the second insulating interlayer 255 and the first contact plug structure 270, and the second and third insulating interlayers 255 and 280 and the first capping pattern 240 may be partially removed by an etching process to form a third opening exposing an upper surface of the first gate electrode 230. The third insulating interlayer 280 may be partially removed to form a fourth opening exposing an upper surface of the first contact plug structure 270. A second contact plug 290 and a first via 295 may be formed in the third and fourth openings, respectively.

As described above, the first barrier layer 263, which may be thinner than the first conductive layer 265, may be formed on the bottom and the sidewall of the second opening 260. Further, the first conductive layer 265 may be formed on the first barrier layer 263 by the PVD process, and the second conductive layer 267 may be formed to fill the remaining portion of the second opening 260 by the CVD process using the first conductive layer 265 as a seed. In addition, the first barrier layer 263 and the first and second conductive layers 265 and 267 may be planarized until the upper surface of the second insulating interlayer 255 is exposed, to form the first contact plug structure 270 including the first barrier pattern 264 and the first and second conductive pattern 266 and 268.

The first conductive layer 265 may be formed by the PVD process instead of a CVD process which may use, e.g., $WF_6$ or $WCl_6$ as a source gas. Thus, the first barrier layer 263 is not needed to be thickly formed so as to prevent $WF_6$ or $WCl_6$, which are highly reactive, from reacting with surrounding materials.

In addition, the first conductive layer 265 may be formed by the PVD process instead of a CVD process in which a reduction gas including, e.g., boron (B) or silicon (Si) is used, and thus may have a relatively low resistance.

Furthermore, if the second conductive layer 267 is formed through a CVD process in which a reduction gas including, e.g., hydrogen (H) is used, the second conductive layer 267 might not include impurities, and thus, may have a relatively low resistance, as the first conductive layer 265.

As a result, the first conductive pattern 266 and/or the second conductive pattern 268 included in the first contact plug structure 270 may have relatively low resistances, and the first barrier pattern 264, which may have a relatively high resistance, may have a relatively small volume. Accordingly, a total resistance of the first contact plug structure 270 including the first and second conductive pattern 266 and 268 and the first barrier pattern 264 may be relatively low.

In addition, due to the influence of the material, e.g., titanium nitride (TiN) included in the first barrier pattern 264, grains of the metal included in the first and second conductive layers 265 and 267 may be formed in a small size. Thus, during the planarization process on the first and second conductive layers 265 and 267, the difference in the removal rate of the first and second conductive layers 265 and 267 may be small. Accordingly, the first conductive structure 269 including the first and second conductive patterns 266 and 268 may have a substantially flat upper surface.

Figure 21:
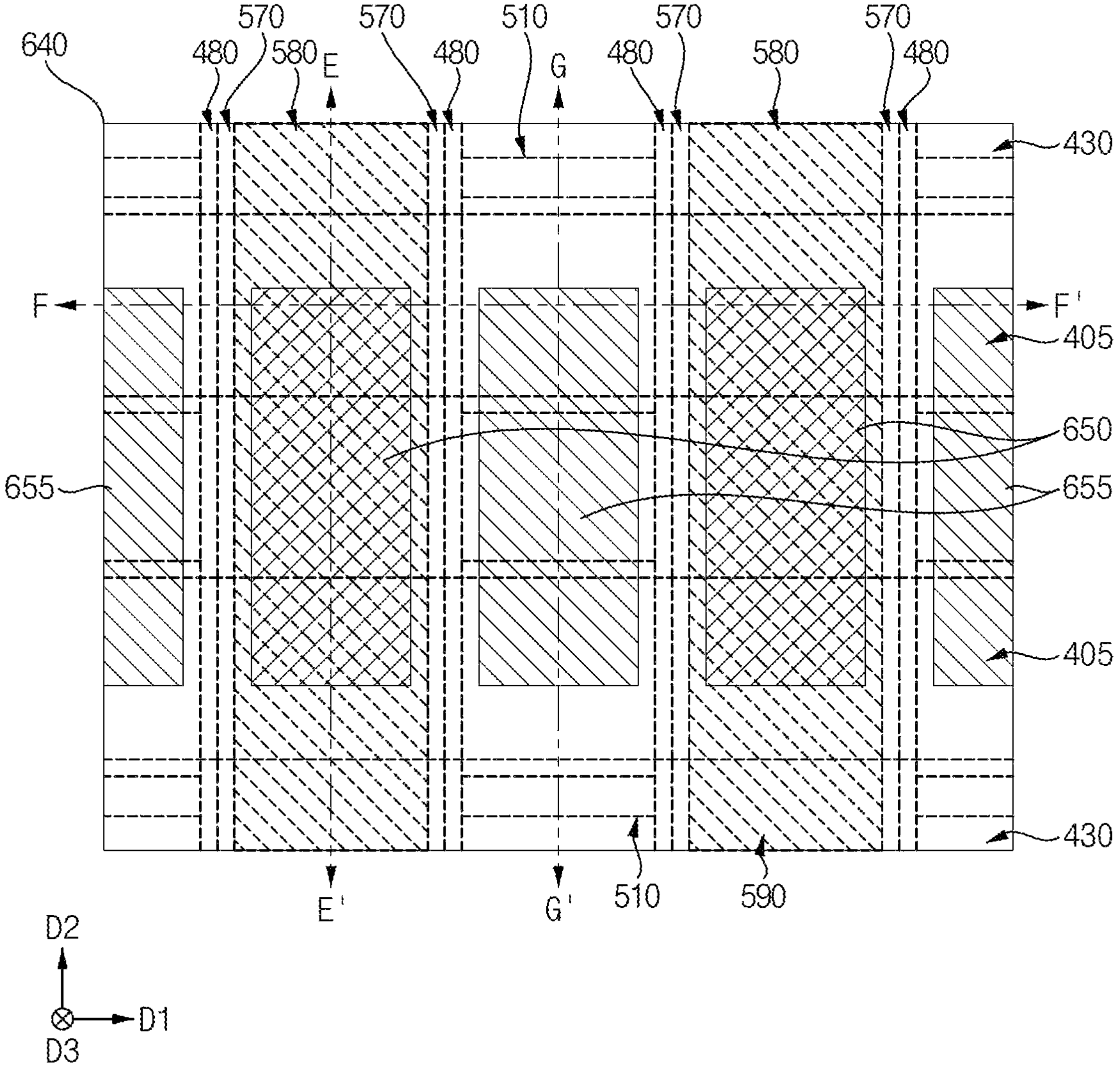
FIGS. 21, 22, 23 and 24 are a cross-sectional view illustrating a semiconductor device in accordance with example embodiments of the present inventive concept, corresponding to FIG. 3, FIGS. 25, 26, 27, 28, 29, 30, 31, 32, 33, 34, 35 and 36 are plan views and cross-sectional views illustrating a method of manufacturing a semiconductor device in accordance with example embodiments of the present inventive concept.
Figure 22:
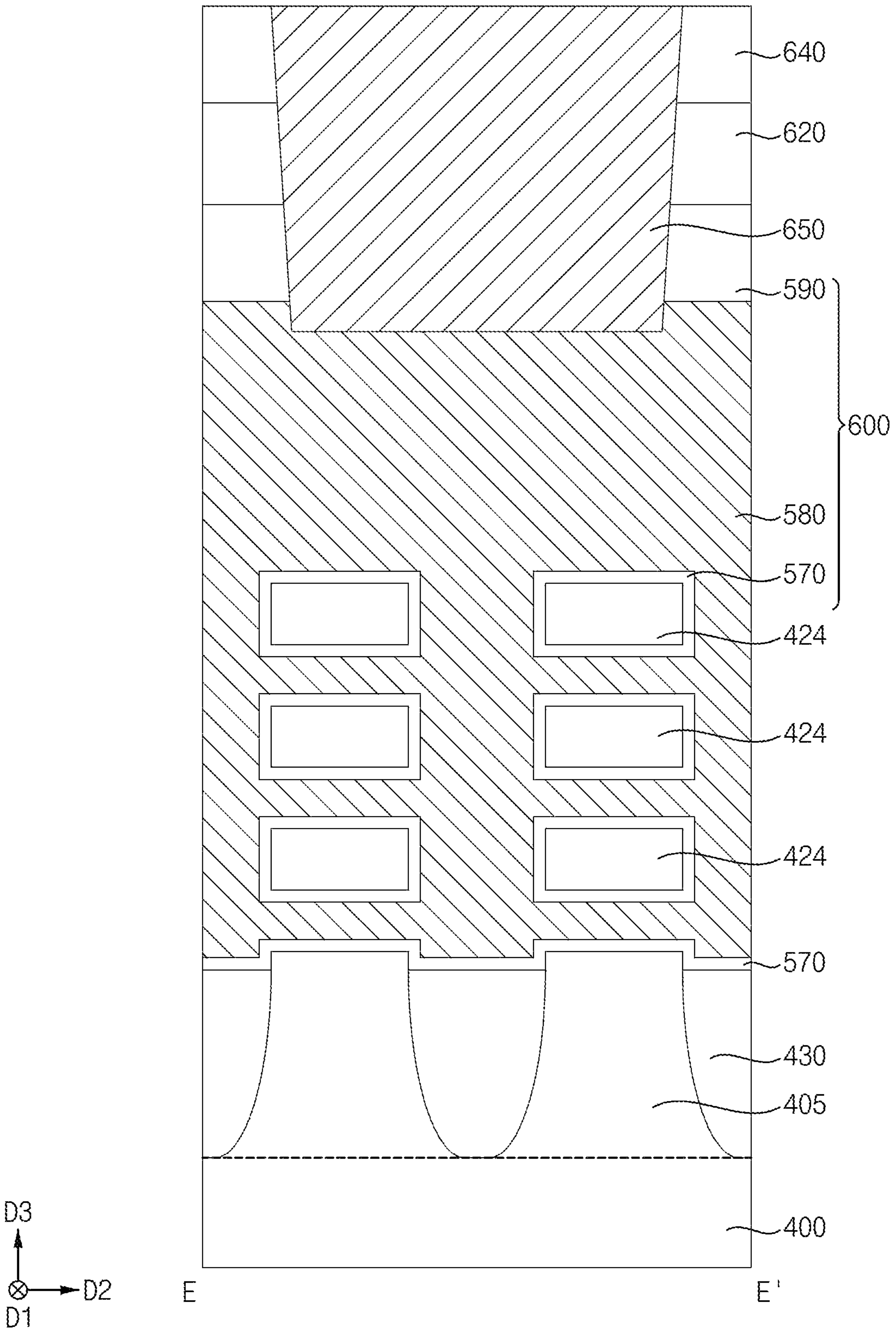
Figure 23:
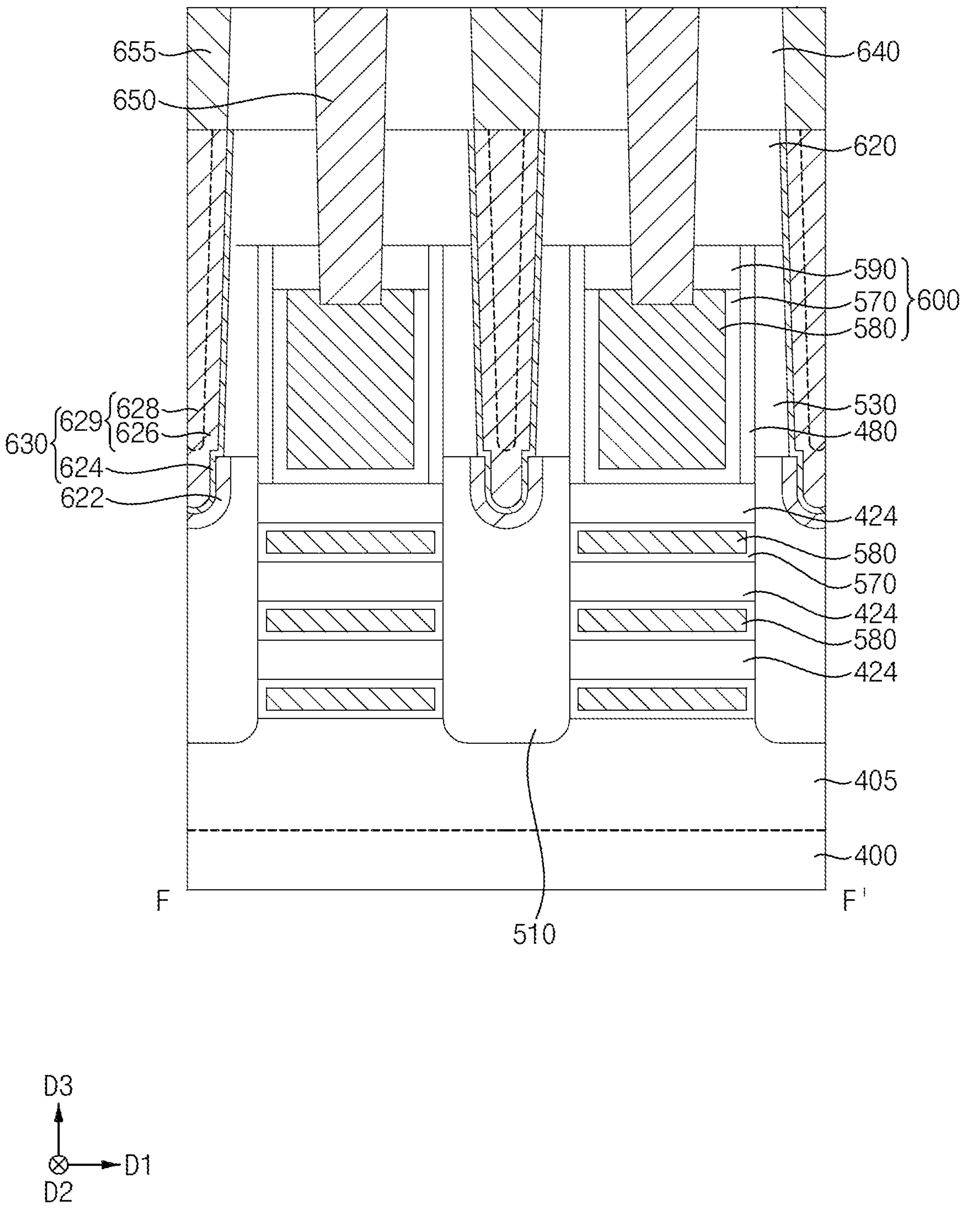
Figure 24:
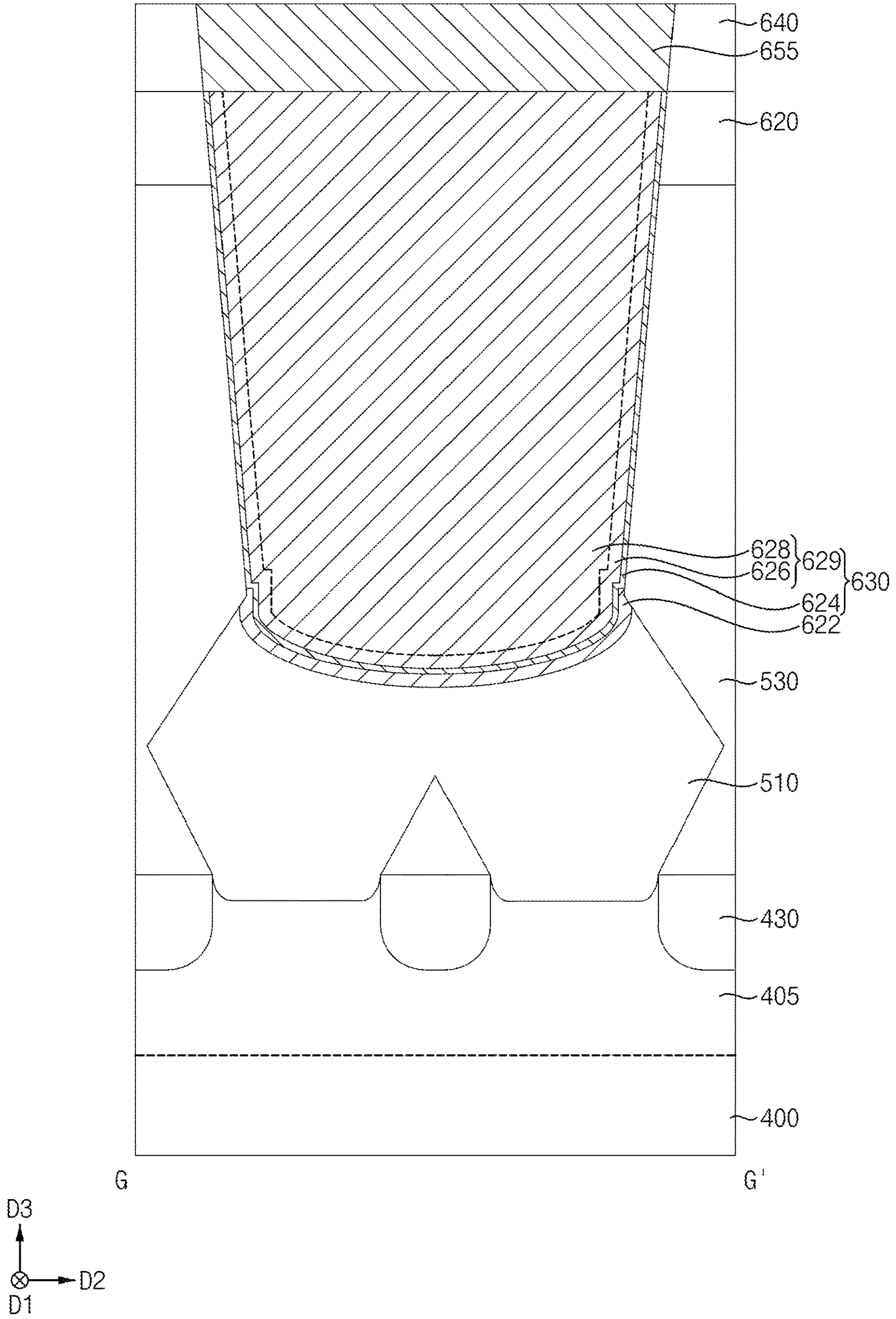

FIGS. 21 to 24 are a plan view and cross-sectional views illustrating a semiconductor device in accordance with example embodiments of the present inventive concept. Particularly, FIG. 21 is the plan view, FIG. 22 is a cross-sectional view taken along line E-E' of FIG. 21. FIG. 23 is a cross-sectional view taken along line F-F' of FIG. 2I, and FIG. 24 is a cross-sectional view taken along line G-G' of FIG. 21.

This semiconductor device may include elements substantially the same as or similar to those illustrated with reference to FIGS. 1 to 4, and thus repeated explanations thereof are omitted or briefly discussed herein.

As illustrated below, the semiconductor device may be a multi-bridge channel field effect transistor (MBCFET) including semiconductor patterns 424 spaced apart from each other in the third direction D3 and serving as channels, respectively. Thus, other elements except for the semiconductor patterns 424 may have similar functions and structures to corresponding elements included in the finFET of FIGS. 1 to 4.

Referring to FIGS. 21 to 24, the semiconductor device may include a second gate structure 600, a second source/drain layer 510 and a third contact plug structure 630.

Additionally, the semiconductor device may include a second active pattern 405, a second gate spacer 480, a second ohmic contact pattern 662, a fourth contact plug 650, a second via 655 and fourth to sixth insulating interlayers 530, 620 and 640.

The second active pattern 405 and the second isolation pattern 430 may correspond to the first active pattern 105 and the first isolation pattern 110, respectively, of FIGS. 1 to 4.

In some example embodiments of the present inventive concept, a plurality of semiconductor patterns 424 may be formed at a plurality of levels, respectively, and may be spaced apart from each other in the third direction D3 from an upper surface of the second active pattern 405. Each of the plurality of semiconductor patterns 424 may extend in the first direction D1. FIGS. 22 and 23 show three semiconductor patterns 424 at three levels, respectively, however, the present inventive concept is not necessarily limited thereto.

In some example embodiments of the present inventive concept, the semiconductor pattern 424 may be a nano-sheet or nano-wire including a semiconductor material, e.g., silicon, germanium, etc. In some example embodiments of the present inventive concept, the semiconductor pattern 424 may serve as a channel in a transistor, and thus may also be referred to as a channel.

The second gate structure 600 and the second gate spacer 480 may correspond to the first gate structure 250 and the first gate spacer 160, respectively, of FIGS. 1 to 4.

Thus, the second gate structure 600 may extend in the second direction D2 on the second active pattern 405 and the second isolation pattern 430, and may include a second gate insulation pattern 570, a second gate electrode 580 and a second capping pattern 590.

The second gate structure 600 may at least partially surround a central portion in the first direction D1 of each of the semiconductor patterns 424, and may cover lower and upper surfaces and opposite sidewalls in the second direction D2 of each of the semiconductor patterns 424.

Thus, the second gate insulation pattern 570 may be formed on a surface of each of the semiconductor patterns 424, upper surfaces of the second active pattern 405 and the second isolation pattern 430, a sidewall of the second source/drain layer 510 and an inner sidewall of the second gate spacer 480. Further, the second gate electrode 580 may fill a space between the semiconductor patterns 424 spaced apart from each other in the third direction a space between the second active pattern 405 and a lowermost one of the semiconductor pattern 424, and a space between the second gate spacers 480 on an uppermost one of the semiconductor patterns 424, In addition, the second capping pattern 590 may be formed on the second gate insulation pattern 570 and the second gate electrode 580 to contact upper surfaces of the second gate electrode 580 and the second gate insulation pattern 570.

The second source/drain layer 510 may correspond to the first source/drain layer 190 of FIGS. 1 to 4. The second source/drain layer 510 may be formed in a third recess on a portion of the second active pattern 405 that is adjacent to the second gate structure 600.

The second ohmic contact pattern 622 and the third contact plug structure 630 may correspond to the first ohmic contact pattern 262 and the first contact plug structure 270, respectively, of FIGS. 1 to 4. Accordingly, the second ohmic contact pattern 622 may contact an upper surface of the second source/drain layer 510, and the third contact plug structure 630 may extend through the fourth and fifth insulating interlayers 530 and 620 and may contact an upper surface of the second ohmic contact pattern 622.

A second barrier pattern 624 and a second conductive structure 629 included in the third contact plug structure 630 may correspond to the first barrier pattern 264 and the first conductive structure 269, respectively, of FIGS. 1 to 4, and third and fourth conductive patterns 626 and 628 included in the second conductive structure 629 may correspond to the first and second conductive patterns 266 and 268, respectively, of FIGS. 1 to 4.

The fourth contact plug 650 and the second via 655 may correspond to the second contact plug 290 and the first via 295 of FIGS. 1 to 4. Accordingly, the fourth contact plug 670 may extend through the second capping pattern 590 and the fifth and sixth insulating interlayers 620 and 640 and may be disposed on an upper surface of the second gate electrode 580, and the second via 655 may extend through the sixth insulating interlayer 640 and may be disposed on an upper surface of the third contact plug structure 630. For example, the fourth contact plug 650 may contact the upper surface of the second gate electrode 580, and the second via 655 may contact the upper surface of the third contact plug structure 630.

FIGS. 25 to 38 are plan views and cross-sectional views illustrating a method of manufacturing a semiconductor device in accordance with example embodiments of the present inventive concept. Particularly, FIGS. 25, 27, 30 and 34 are the plan views, and FIGS. 26, 28-29, 31-33 and 35-38 are the cross-sectional views.

Figure 26:
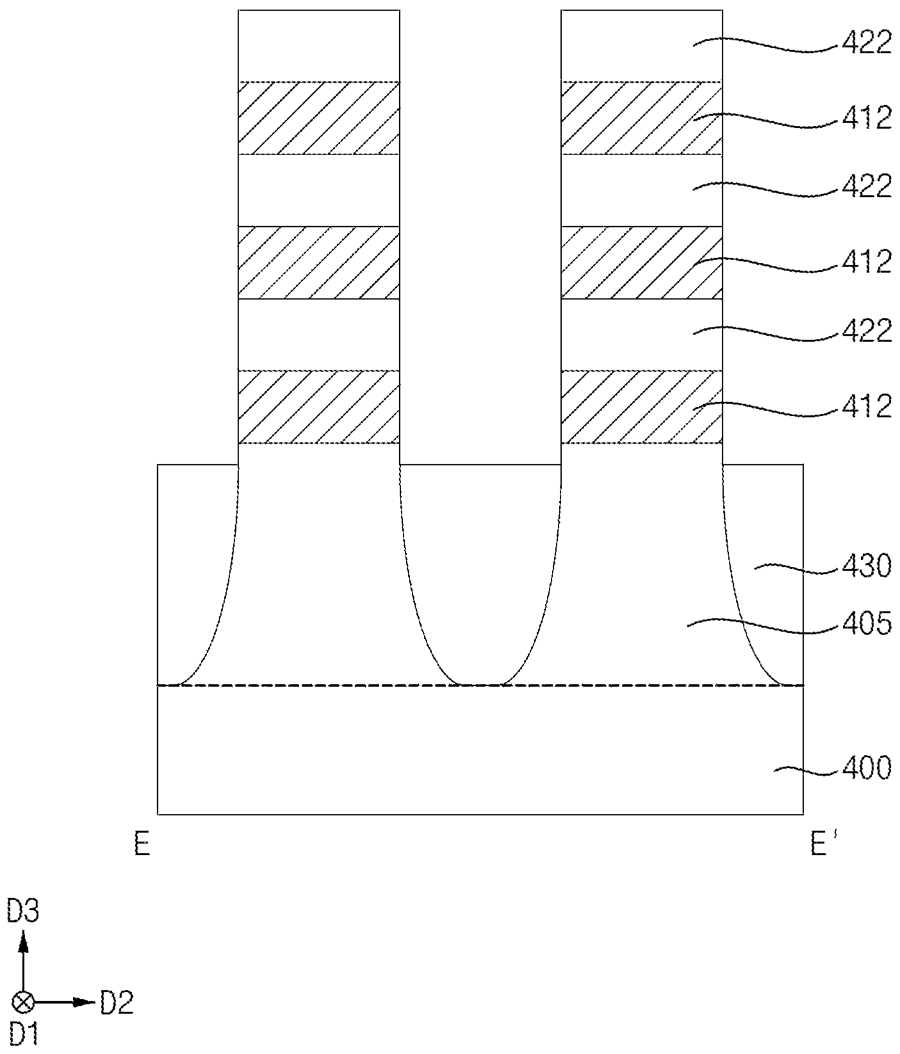
Figure 28:
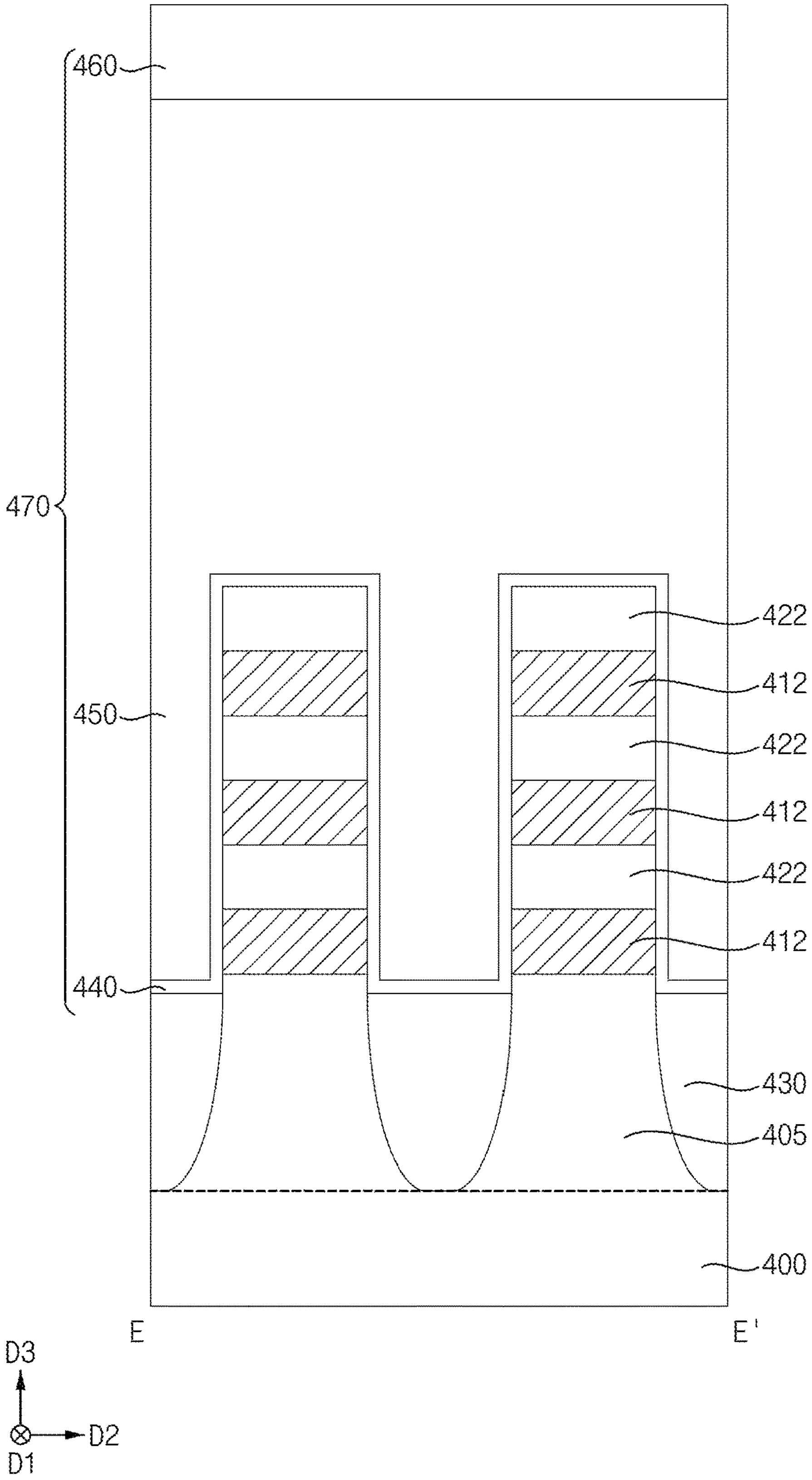
Figure 35:
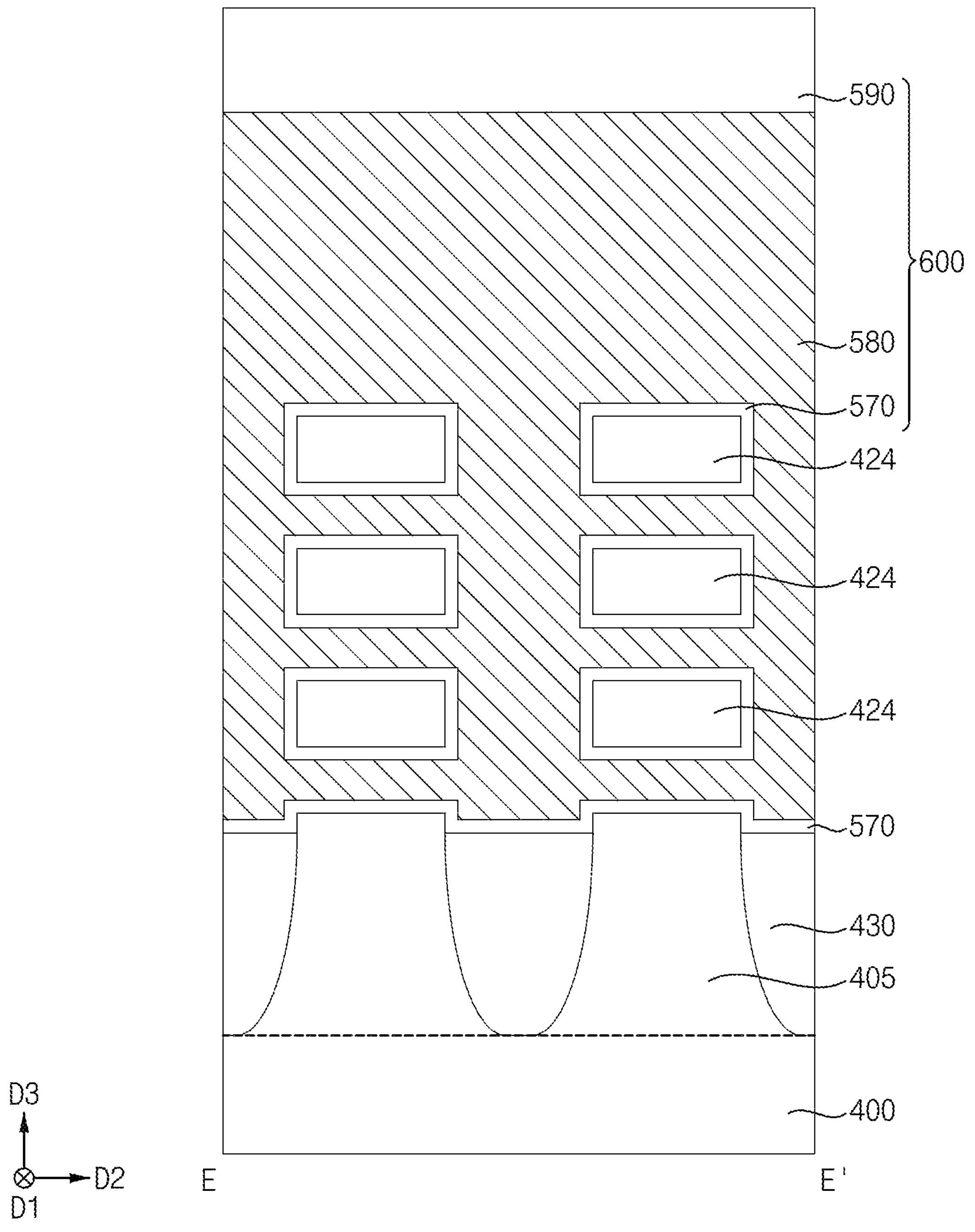

FIGS. 26, 28 and 35 are cross-sectional views taken along lines E-E' of corresponding plan views, respectively. FIGS. 29, 31, 33 and 36-38 are cross-sectional views taken along lines F-F' of corresponding plan views, respectively, and FIG. 32 is a cross-sectional view taken along line G-G' of a corresponding plan view.

This method may include processes substantially the same as or similar to those illustrated with reference to FIGS. 5 to 20 and FIGS. 1 to 4, and thus, repeated explanations thereof may be omitted or briefly discussed herein.

Figure 25:
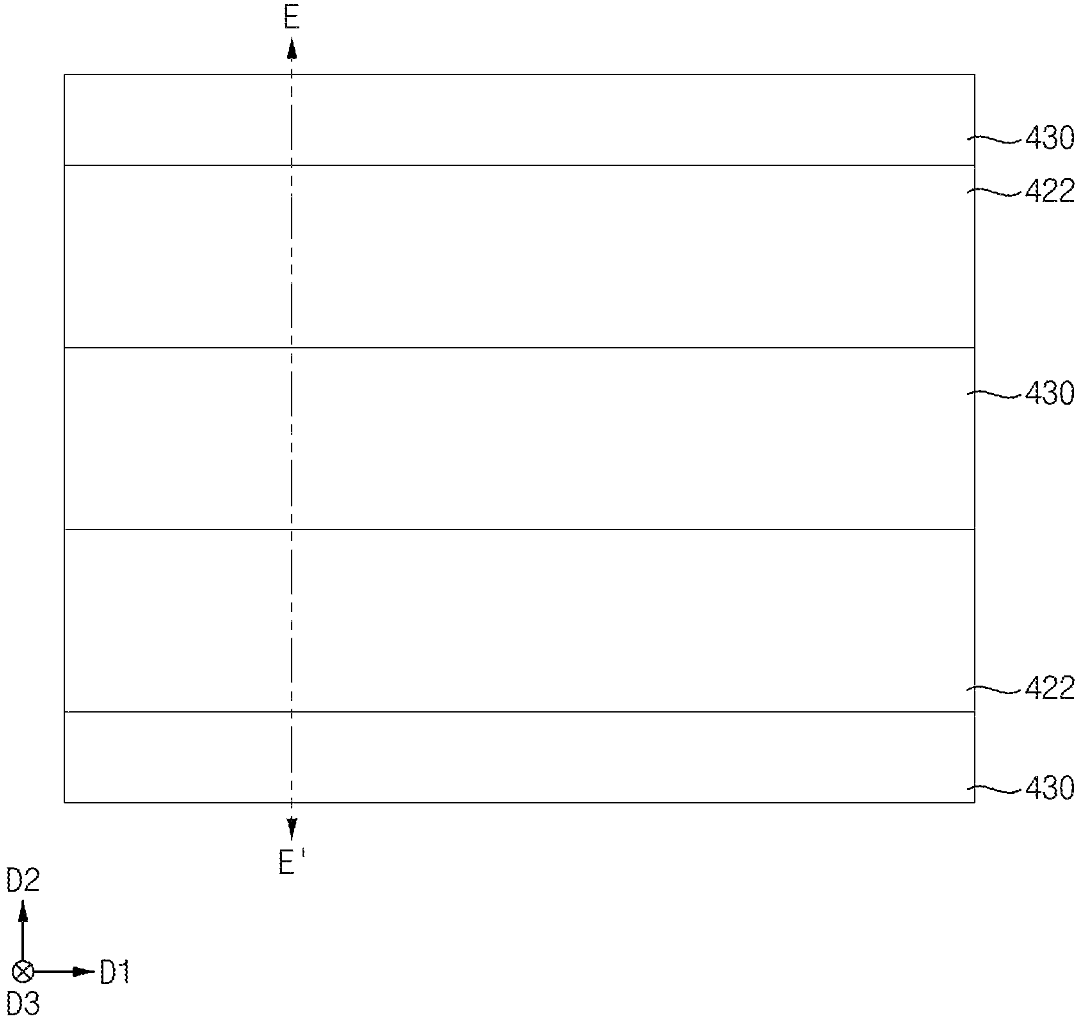

Referring to FIGS. 25 and 26, a sacrificial layer and a semiconductor layer may be alternately and repeatedly stacked on a substrate 400. Further, a first etching mask extending in the first direction D1 may be formed on an uppermost one of the semiconductor layers, and the semiconductor layers, the sacrificial layers and an upper portion of the substrate 400 may be etched using the first etching mask.

Thus, a second active pattern 405 extending in the first direction D1 may be formed on the substrate 400, and a fin structure including sacrificial lines 412 and semiconductor lines 422 alternately and repeatedly stacked in the third direction D3 may be formed on the second active pattern 405. In some example embodiments of the present inventive concept, a plurality of fin structures may be spaced apart from each other in the second direction D2 on the substrate 400.

FIG. 26 shows three sacrificial lines 412 and three semiconductor lines 422 at three levels, respectively, however the present inventive concept might not necessarily be limited thereto. The sacrificial lines 412 may include a material having an etching selectivity with respect to the substrate 400 and the semiconductor lines 422, e.g., silicon-germanium.

A second isolation pattern 430 may be formed on the substrate 400 to cover a sidewall of the second active pattern 405.

Figure 27:
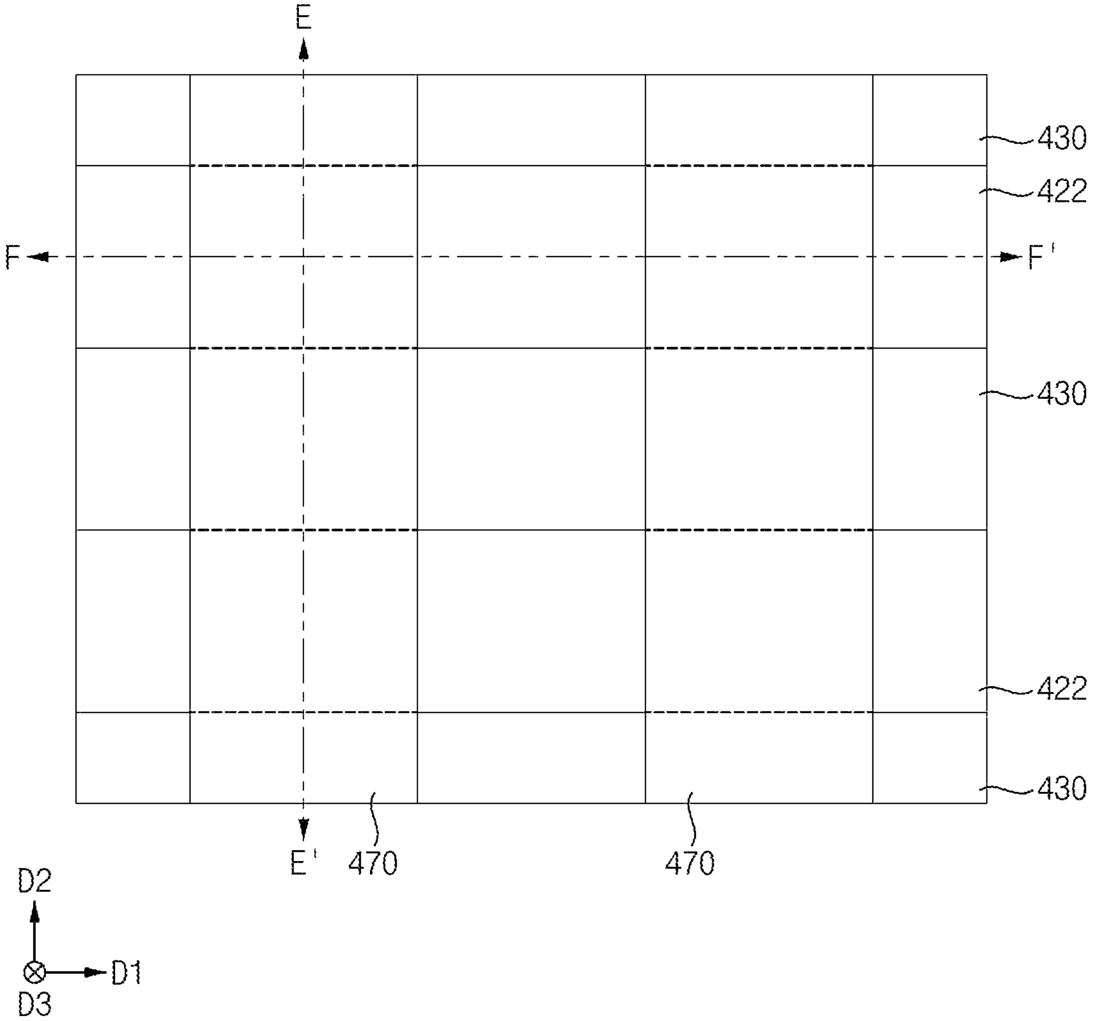
Figure 29:
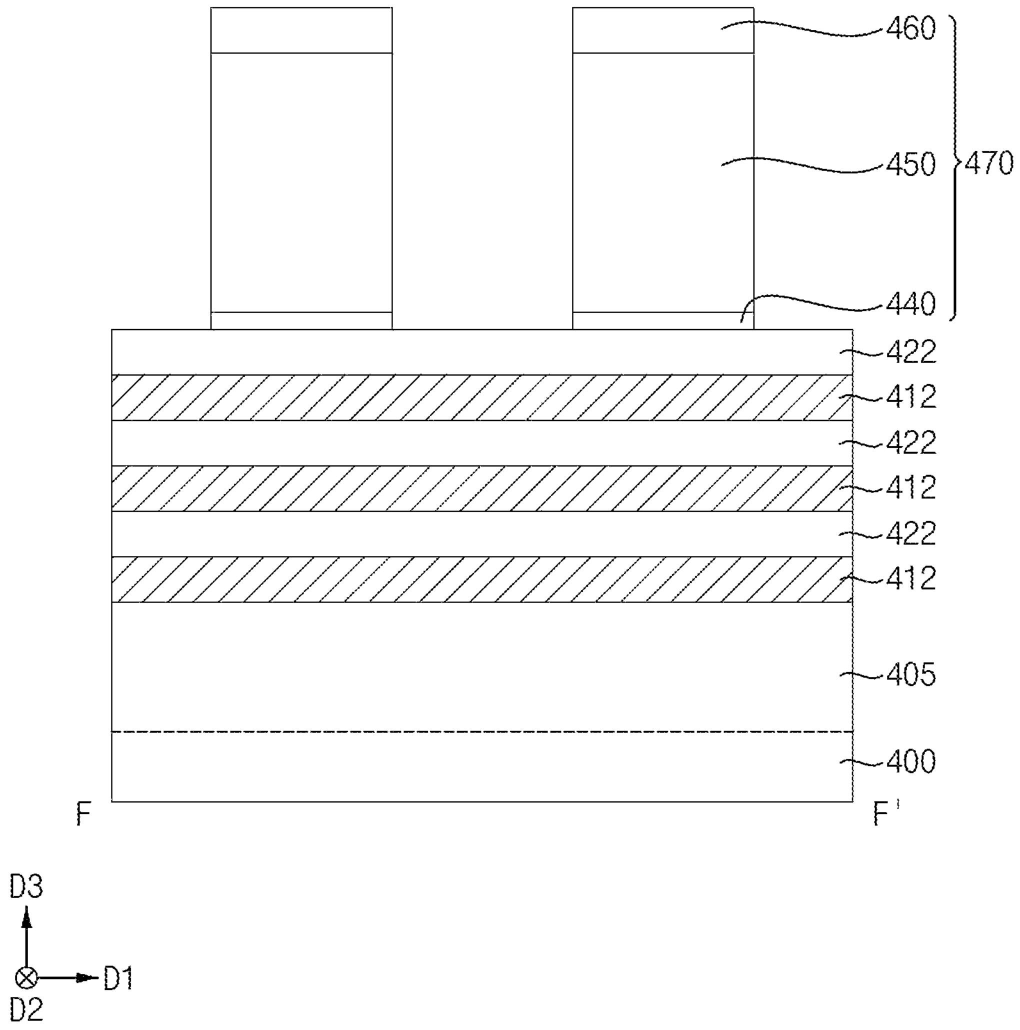

Referring to FIGS. 27 to 29, a second dummy gate structure 470 may be formed to at least partially cover the fin structure and the second isolation pattern 430.

For example, a second dummy gate insulation layer, a second dummy gate electrode layer and a second dummy gate mask layer may be sequentially formed on the fin structure and the second isolation pattern 430. Further, a second etching mask extending in the second direction D2 may be formed on the second dummy gate mask layer, and the second dummy gate mask layer may be etched using the second etching mask to form a second dummy gate mask 460.

The second dummy gate electrode layer and the second dummy gate insulation layer may be etched using the second dummy gate mask 460 as an etching mask to form a second dummy gate electrode 450 and a second dummy gate insulation pattern 440, respectively, on the substrate 400.

The second dummy gate insulation pattern 440, the second dummy gate electrode 450 and the second dummy gate mask 460, which are sequentially stacked in the third direction D3 on the second active pattern 405, and a portion of the second isolation pattern 430 adjacent thereto ay collectively form a second dummy gate structure 470.

In some example embodiments of the present inventive concept, the second dummy gate structure 470 may extend in the second direction D2 on the fin structure and the second isolation pattern 430, and may cover an upper surface and opposite sidewalls in the second direction D2 of the fin structure.

In some example embodiments of the present inventive concept, a plurality of second dummy gate structures 470 may be spaced apart from each other in the first direction D1.

Figure 30:
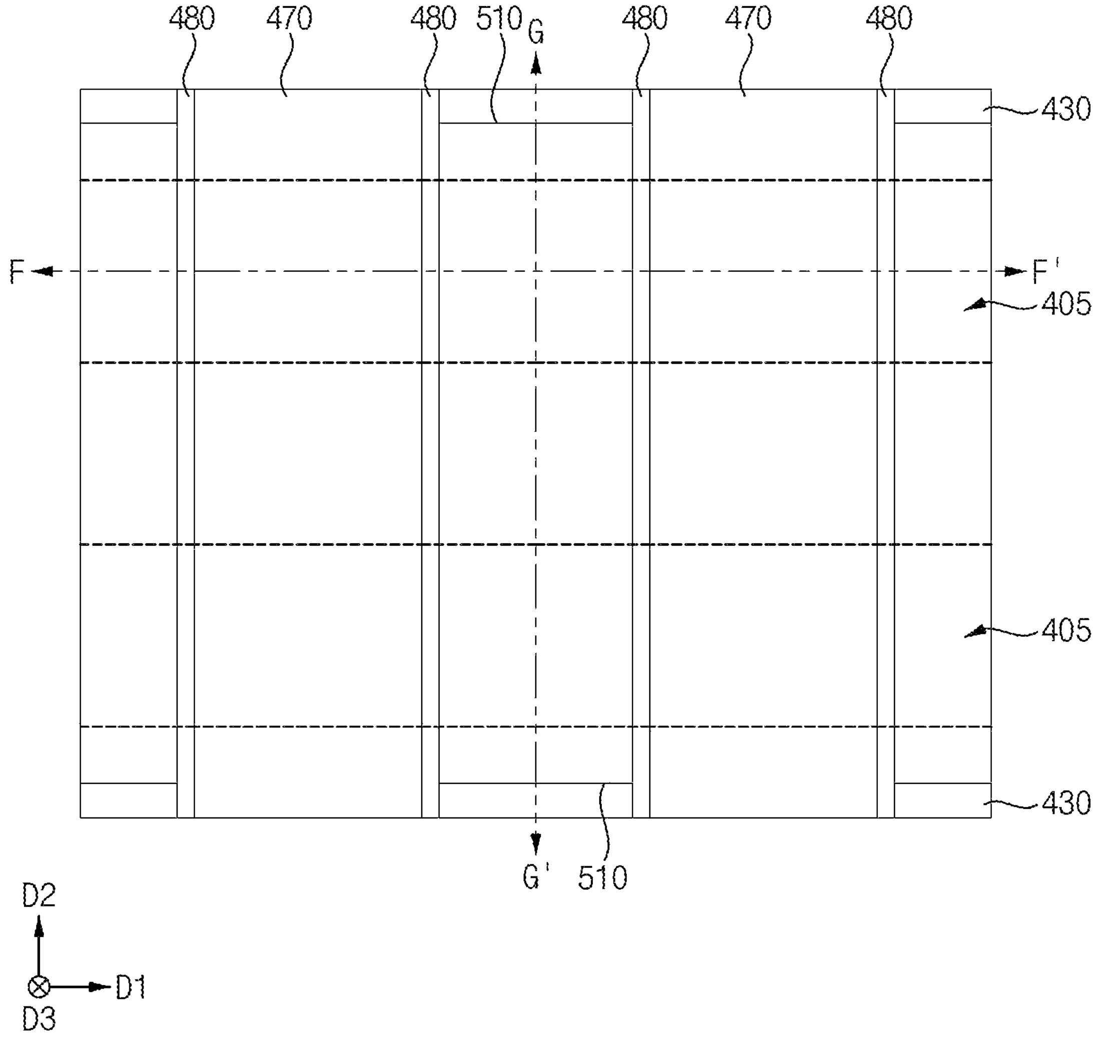
Figure 31:
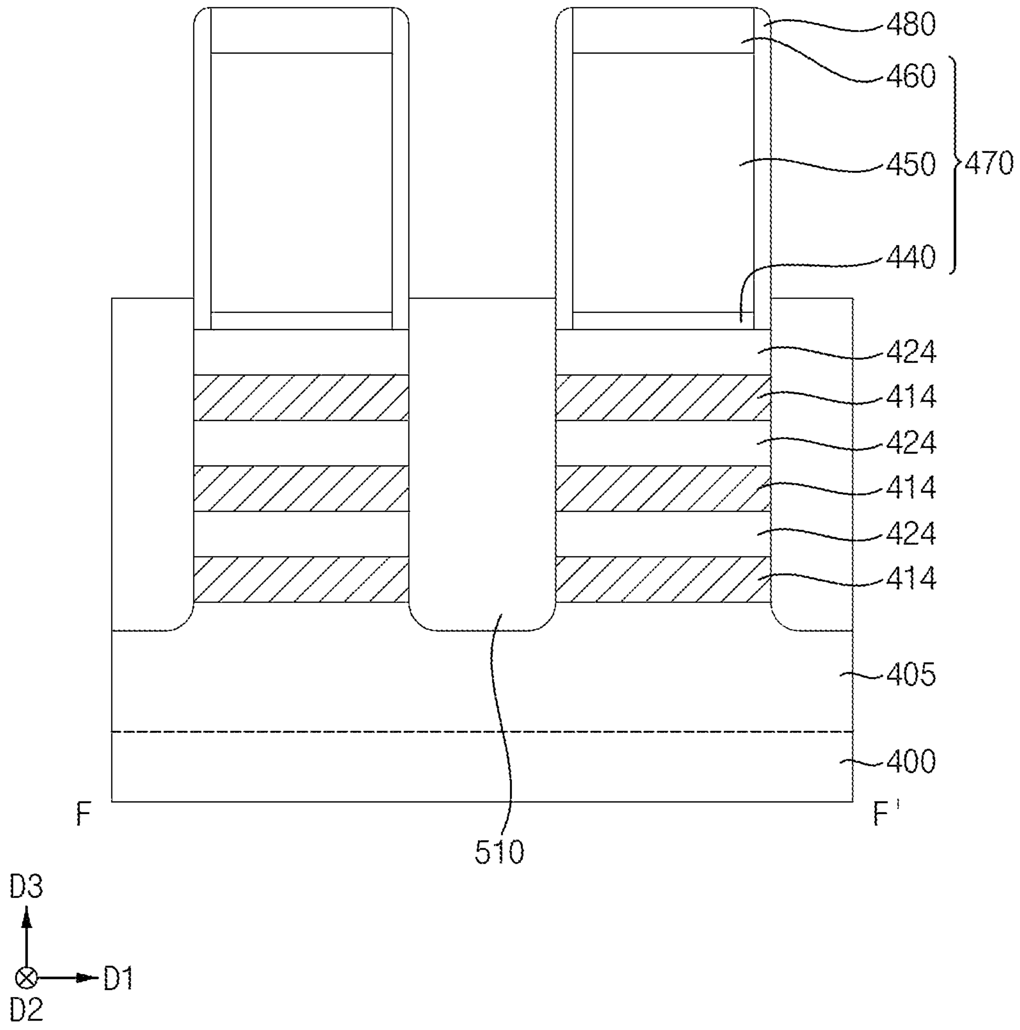
Figure 32:
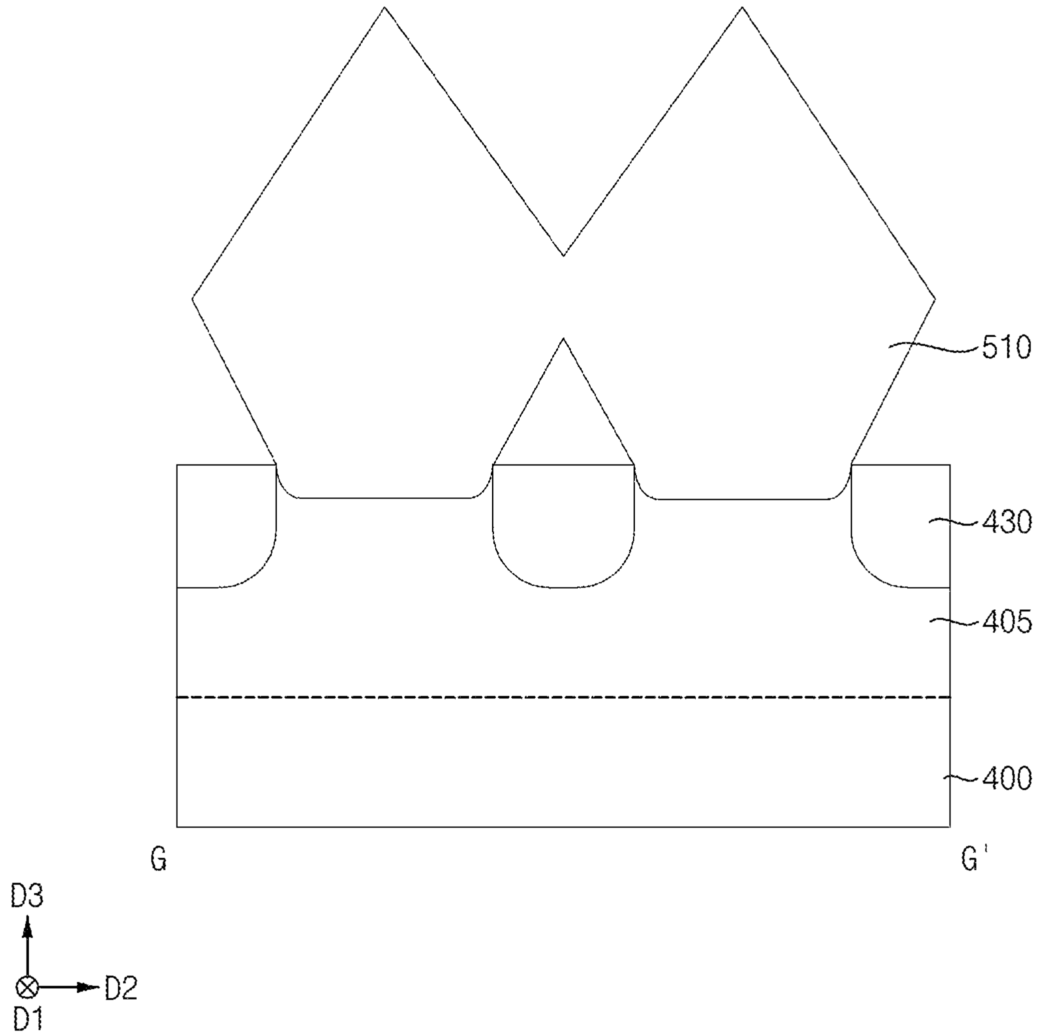

Referring to FIGS. 30 to 32, a second gate spacer 480 may be formed on sidewalls of the second dummy gate structure 470.

For example, a second spacer layer may be formed on the substrate 400, which has the fin structure, the second isolation pattern 430 and the second dummy gate structure 470, which are formed on the substrate 400, and may be anisotropically etched to form the second gate spacer 480 covering each of opposite sidewalls in the first direction D1 of the second dummy gate structure 470.

The fin structure and an upper portion of the second active pattern 405 may be etched using the second dummy gate structure 470 and the second gate spacer 480 as an etching mask to form a fifth opening.

Thus, the sacrificial lines 412 and the semiconductor lines 422 under the second dummy gate structure 470 and the second gate spacer 480 may be transformed into sacrificial patterns 414 and semiconductor patterns 424, respectively, and the fin structure extending in the first direction D1 may be divided into a plurality of parts spaced apart from each other in the first direction D1.

Hereinafter, the second dummy gate structure 470 the second gate spacers 480, which is on opposite sidewalls of the second dummy gate structure 470, and the fin structure may be referred to as a stack structure.

In some example embodiments of the present inventive concept, the stack structure may extend in the second direction D2. In some example embodiments of the present inventive concept, and a plurality of stack structures may be spaced apart from each other in the first direction D1.

In some example embodiments of the present inventive concept, a portion of each of the sacrificial patterns 414 adjacent to the fifth opening may be removed to form a gap, and an inner spacer may be formed in the gap.

A selective epitaxial growth (SEG) process may be performed using the upper surface of the second active pattern 405 and the sidewalls of the semiconductor patterns 424 and the sacrificial patterns 414 exposed by the fifth opening as a seed to form second source/drain layer 510 in the fifth opening.

In an example embodiment of the present inventive concept, a single crystalline silicon-germanium layer doped with p-type impurities may be formed as the second source/drain layer 510. In addition, a single crystalline silicon layer doped with n-type impurities or a single crystalline silicon carbide layer doped with n-type impurities may be formed as each of the second source/drain layer 510.

Figure 33:
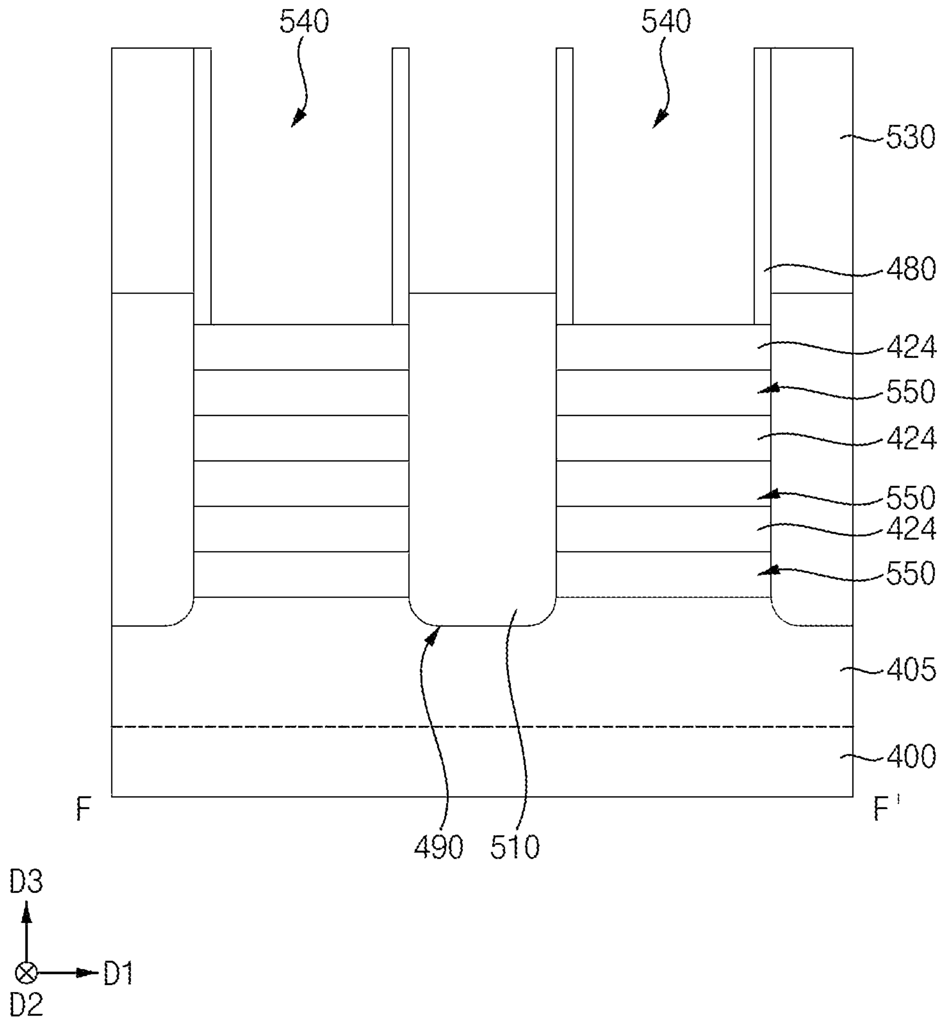

Referring to FIG. 33, a fourth insulating interlayer 530 may be formed on the substrate 400 to cover the stack structures and the second source/drain layer 510, and a planarization process may be performed until upper surfaces of the second dummy gate electrodes 450 included in the stack structures, respectively, are exposed so that an upper portion of the fourth insulating interlayer 530 and the second dummy gate masks 460 included in the second dummy date structures 470 may be removed.

The second dummy gate electrodes 450, the second dummy gate insulation patterns 440 and the sacrificial patterns 414 may be removed by, e.g., a wet etching process and/or a dry etching process. Thus, a sixth opening 540, which exposes an inner sidewall of the second gate spacer 480 and an upper surface of an uppermost one of the semiconductor patterns 424, and a seventh opening 550, which exposes a sidewall of the second source/drain layer 510, surfaces of the semiconductor patterns 424 and an upper surface of the second active pattern 405 may be formed.

Figure 34:
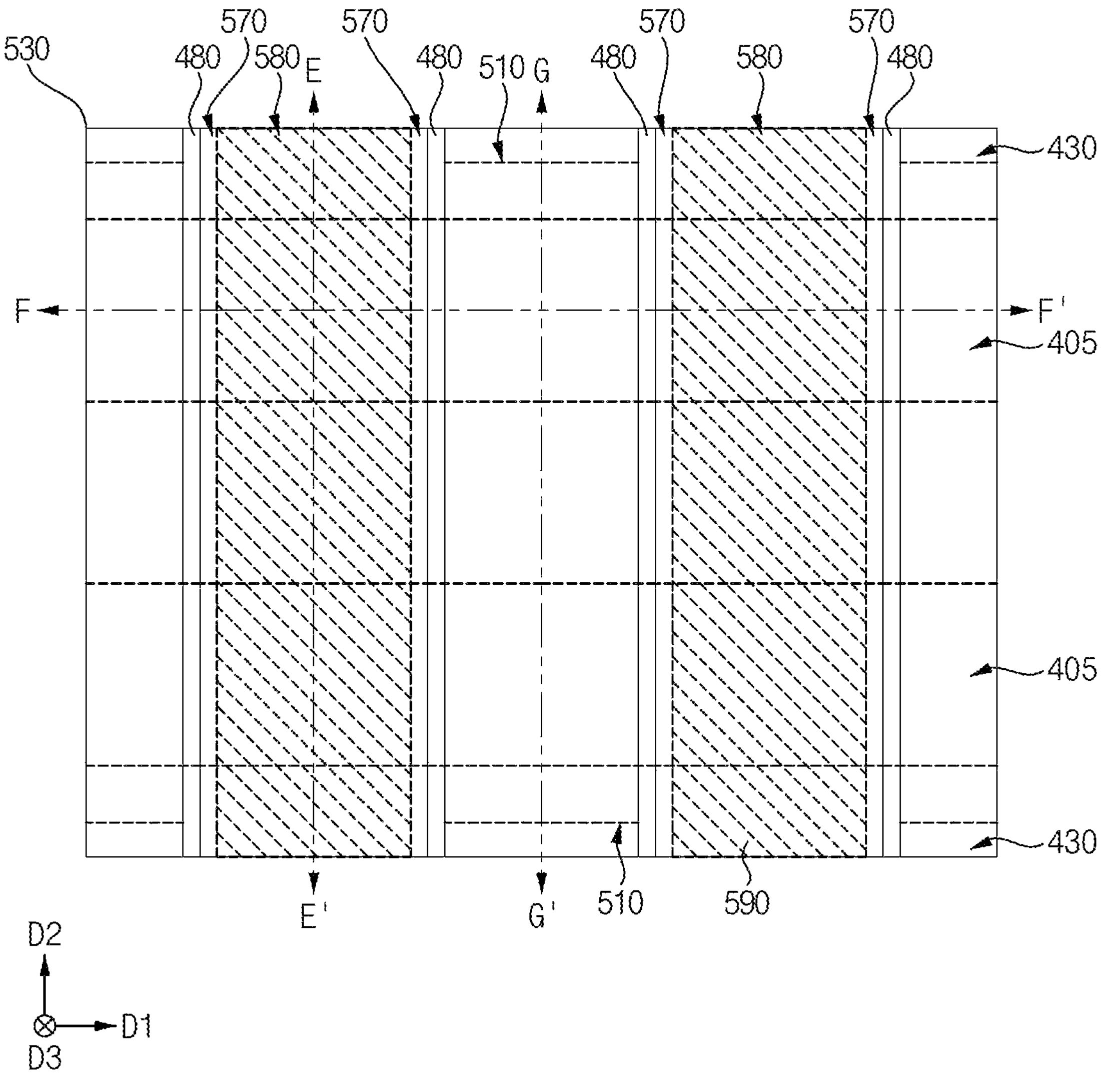
Figure 36:
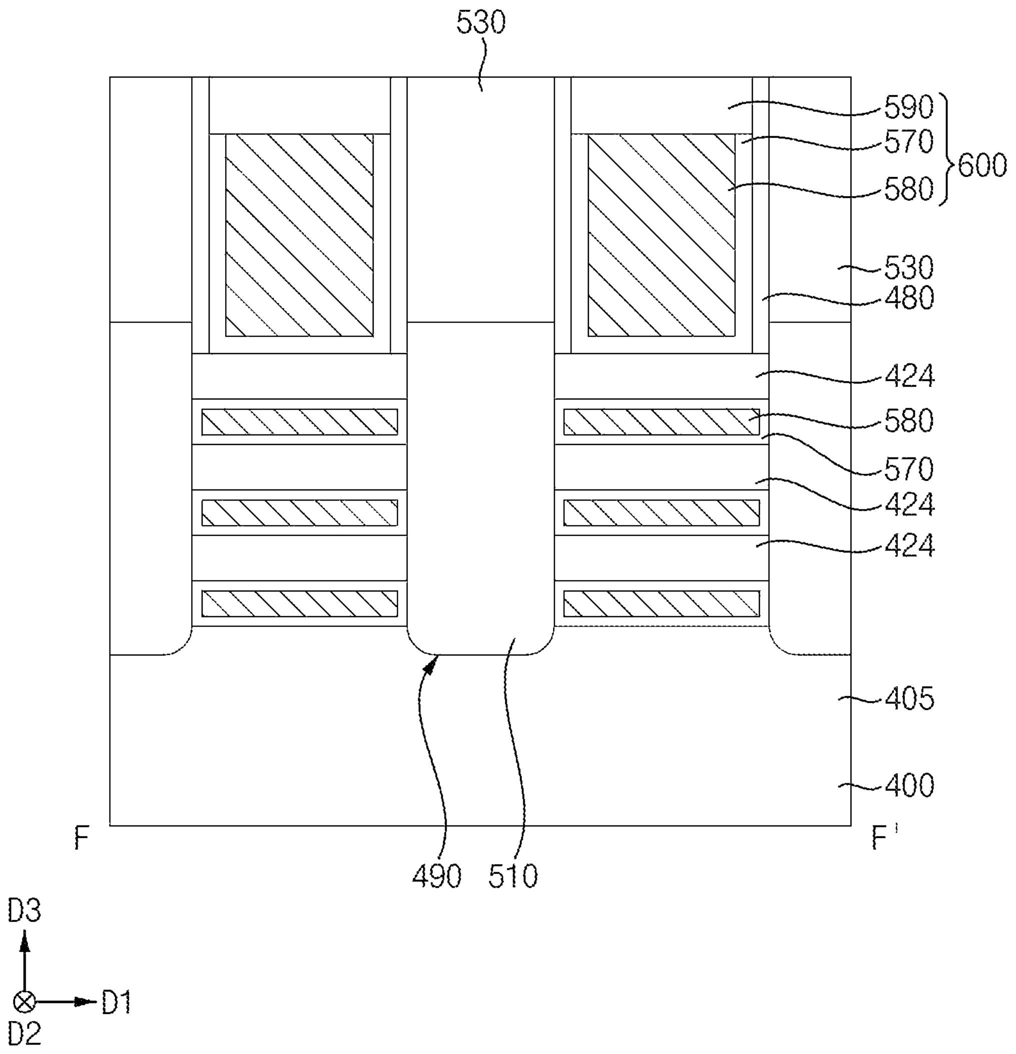

Referring to FIGS. 34 to 36, processes substantially the same as or similar to those illustrated with reference to FIGS. 12 to 14 may be performed.

Thus, a second gate structure 600 including a second gate insulation pattern 570, a second gate electrode 580, and a second capping pattern 590 may be formed in the sixth and seventh openings 540 and 550. The second gate insulation pattern 570 may be disposed on the upper surface of the second active pattern 405, the upper surface of the second isolation pattern 430, the sidewall of the second source/drain layer 510, the surfaces of the semiconductor patterns 424 and an inner lower sidewall of the second gate spacer 480 in the sixth and seventh openings 540 and 550. The second gate electrode 580 may be disposed on the second gate insulation pattern 570 and may fill a lower portion of the sixth opening 540 and the seventh opening 550. The second capping pattern 590 may be disposed on the second gate electrode 580 and the second gate insulation pattern 570 and may fill an upper portion of the sixth opening 540 to contact an inner upper sidewall of the second gate spacer 480.

In an example embodiment of the present inventive concept, an interface pattern including, e.g., silicon oxide may be formed on the upper surface of the second active pattern 405 and the surfaces of the semiconductor patterns 424.

Referring to FIGS. 21 to 24 again, processes substantially the same as or similar to those illustrated with reference to FIGS. 15 to 20 and FIGS. 1 to 4 may be performed.

Thus, a fifth insulating interlayer 620 may be formed on the second gate structure 600, the second gate spacer 480 and the fourth insulating interlayer 530, and an eighth opening may be formed through the fourth and fifth insulating interlayers 530 and 620 to expose an upper surface of the second source/drain layer 510. The eighth opening may partially extend through an upper portion of the second source/drain layer 510.

A second ohmic contact pattern 622 may be formed on the upper surface of the second source/drain layer 510 that is exposed by the eighth opening, and the third contact plug structure 630 may be formed on the second ohmic contact pattern 622 to fill a remaining portion of the eighth opening.

A sixth insulating interlayer 640 may be formed on the fifth insulating interlayer 620 and the third contact plug structure 630, and a fourth contact plug 650 may be formed through the fifth and sixth insulating interlayers 620 and 640 and the second capping pattern 590 and may contact an upper surface of the second gate electrode 580. A second via 655 may be formed through the sixth insulating interlayer 640 and may contact an upper surface of the third contact plug structure 630.

Figure 37:
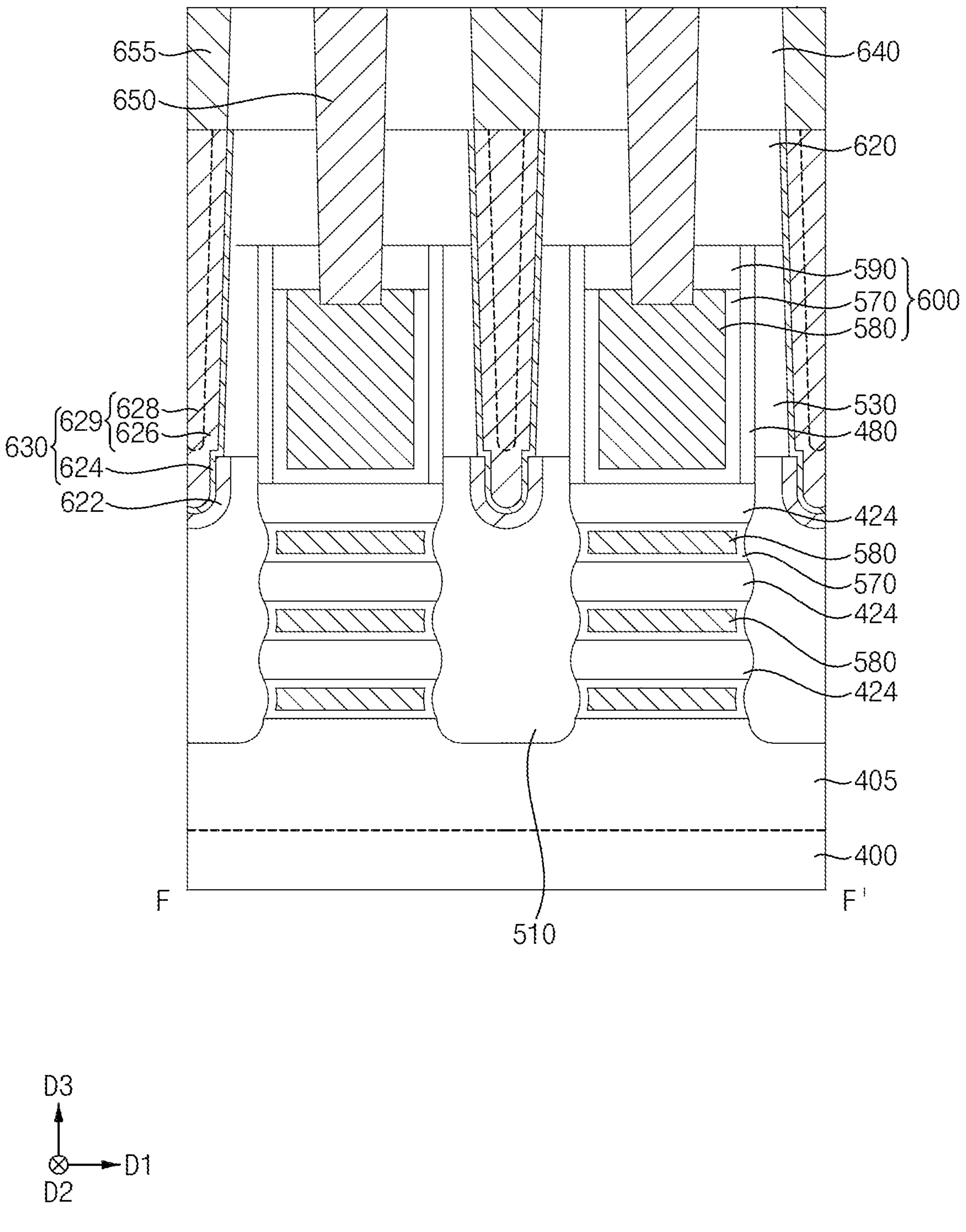
FIGS. 37 and 38 are cross-sectional views illustrating semiconductor devices in accordance with example embodiments of the present inventive concept.
Figure 38:
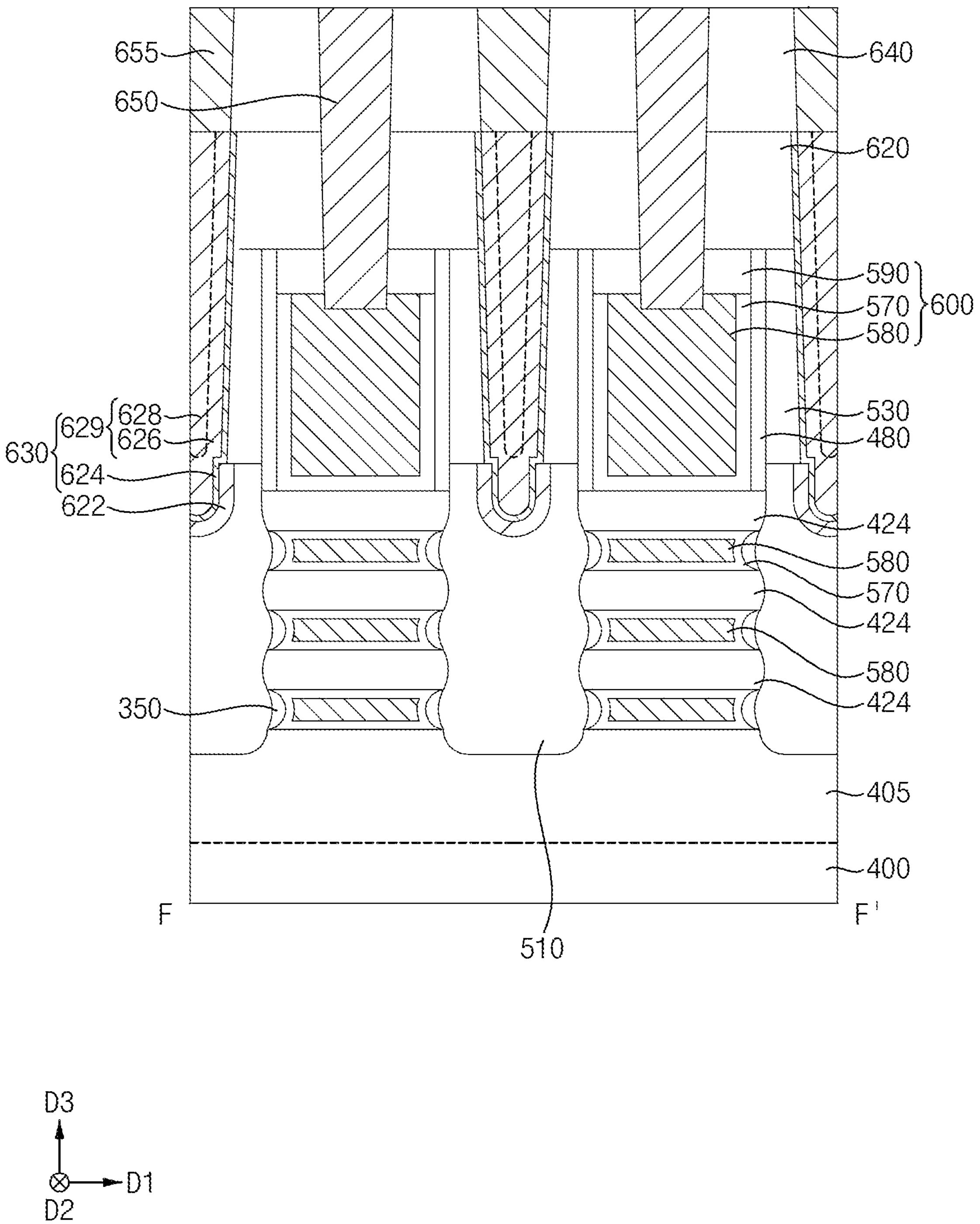

FIGS. 37 to 38 are cross-sectional views illustrating semiconductor devices in accordance with example embodiments of the present inventive concept, which may correspond to FIG. 23. These semiconductor devices may be substantially the same as or similar to that of FIGS. 1 to 4, except for some elements, and thus repeated explanations thereof may be omitted or briefly discussed herein.

Referring to FIG. 37, a sidewall in the first direction D1 of the second source/drain layer 510 might not be substantially perpendicular to the upper surface of the substrate 400, but may have varying slopes with respect to the upper surface of the substrate 400. For example, the sidewall of the second source/drain layer 510 may have an uneven surface.

The sidewall of the second source/drain layer 510 may have a width in the first direction D1 that may change in the third direction D3, particularly, periodically change in the third direction D3. Thus, the sidewall of the second source/ drain layer 510 may have concave portions and convex portions in the first direction D1 that may be alternately and repeatedly stacked in the third direction D3. In some example embodiments of the present inventive concept, a width of the second source/drain layer 510 facing the semiconductor pattern 124 may be less than a width of the second source/drain layer 510 facing the lower portion of the second gate structure 600.

Referring to 38, an inner spacer 350 may be formed between the second source/drain layer 510 and the lower portion of the second gate structure 600.

In an example embodiment of the present inventive concept, the inner spacer 350 may have a convex shape toward the second gate structure 600. The inner spacer 350 may include an insulating nitride, e.g., silicon nitride.

The semiconductor device illustrated above may be used in various memory devices and systems including contact plugs. For example, the semiconductor device may be applied to a logic device such as a central processing unit (CPU, MPU) or an application processor (AP). In addition, the semiconductor device may be applied to a peripheral circuit region or a cell region of a volatile memory device, e.g., DRAM device, SRAM device, etc., or a nonvolatile memory device, e.g., flash memory device, PRAM device, PRAM, MRAM device, REAM device, etc.

While the present inventive concept has been described with reference to example embodiments thereof, it will be understood by those of ordinary skill in the art that various changes in form and details may be made thereto without departing from the spirit and scope of the present inventive concept.

What is claimed is:

1. A semiconductor device, comprising:

an active fin disposed on a substrate and protruding from an upper surface of the substrate;

a gate structure disposed on the active fin;

a source/drain layer disposed on a portion of the active fin adjacent to the gate structure;

an ohmic contact pattern on the source/drain layer, the ohmic contact pattern having a U-shape; and a contact plug disposed on an upper surface of the ohmic contact pattern, wherein the contact plug includes:

a conductive structure including a metal; and a barrier pattern covering a lower surface and a sidewall of the conductive structure, wherein the conductive structure includes:

a second conductive pattern; and a first conductive pattern covering a lower surface and a sidewall of the second conductive pattern, wherein upper surfaces of the first and second conductive patterns are substantially coplanar with each other, and wherein a side surface of the contact plug includes a stepped shape contacting a side surface and an uppermost surface of the U-shape of the ohmic contact pattern.

2. The semiconductor device as claimed in claim 1, wherein the active fin extends in a first direction substantially parallel to the upper surface of the substrate, wherein the gate structure extends in a second direction substantially parallel to the upper surface of the substrate and crossing the first direction, and wherein the conductive structure includes about 25 to about 100 grains per cross-sectional area in the first direction of about 435.2 $nm^2$.

3. The semiconductor device as claimed in claim 1, wherein the conductive structure includes:

a second conductive pattern; and a first conductive pattern covering a lower surface and a sidewall of the second conductive pattern.

4. The semiconductor device as claimed in claim 1, wherein the first conductive pattern does not include boron or silicon, and wherein the second conductive pattern includes boron or silicon.

5. The semiconductor device as claimed in claim 1, wherein the first and second conductive patterns include different metals from each other, and neither the first conductive pattern nor the second conductive pattern includes boron or silicon.

6. The semiconductor device as claimed in claim 1, wherein the first conductive pattern includes a first metal, and does not include boron or silicon, and wherein the second conductive pattern includes a second metal different from the first metal, and further includes boron or silicon.

7. The semiconductor device as claimed in claim 1, the metal includes at least one of tungsten, molybdenum or cobalt.

8. The semiconductor device as claimed in claim 1, the barrier pattern includes a metal nitride.

9. The semiconductor device as claimed in claim 1, the ohmic contact pattern includes a metal silicide.

10. The semiconductor device as claimed in claim 1, wherein a lowermost surface of the contact plug is lower than an uppermost surface of the source/drain layer.

11. The semiconductor device as claimed in claim 8, further comprising:

a plurality of channels spaced apart from each other on the active fin in a vertical direction substantially perpendicular to the upper surface of the substrate, wherein the gate structure at least partially covers upper and lower surfaces and a sidewall of each of the plurality of channels.

12. The semiconductor device as claimed in claim 1, wherein the second conductive pattern is at least partially contained within the first conductive pattern.

13. A semiconductor device, comprising:

a plurality of channels disposed on a substrate and spaced apart from each other on the substrate in a vertical direction substantially perpendicular to an upper surface of the substrate;

a gate structure disposed on the substrate and at least partially covering upper and lower surfaces and a sidewall of each of the plurality of channels;

a source/drain layer disposed on a portion of the substrate and at opposite sides of the gate structure; and a contact plug structure disposed on the source/drain layer, wherein the contact plug structure includes:

a conductive structure including a metal; and a barrier pattern covering a lower surface and a sidewall of the conductive structure, and an ohmic contact pattern disposed between the source/drain layer and the contact plug structure;

wherein the conductive structure includes:

a second conductive pattern; and a first conductive pattern covering a lower surface and a sidewall of the second conductive pattern, and wherein each of the first and second conductive patterns includes a metal, and does not include boron or silicon, wherein upper surfaces of the first and second conductive patterns are substantially coplanar with each other, and wherein the contact plug structure defines a stepped side surface contacting a side surface and an uppermost surface of the ohmic contact pattern.

14. The semiconductor device as claimed in claim 13, wherein the first and second conductive patterns include substantially a same material as each other.

15. The semiconductor device as claimed in claim 13, wherein the first and second conductive patterns include different materials from each other.

16. The semiconductor device as claimed in claim 13, wherein an upper surface of the conductive structure including the first and second conductive patterns is substantially flat.

17. A semiconductor device, comprising:

a plurality of channels disposed on a substrate and spaced apart from each other in a vertical direction substantially perpendicular to an upper surface of the substrate;

a gate structure disposed on the substrate and at least partially covering upper and lower surfaces and a sidewall of each of the plurality of channels;

a source/drain layer disposed on a portion of the substrate and at opposite sides of the gate structure;

an ohmic contact pattern disposed on the source/drain layer; and a first contact plug structure disposed on the ohmic contact pattern, wherein the first contact plug structure includes:

a conductive structure including a metal; and a barrier pattern covering a lower surface and a sidewall of the conductive structure, wherein a thickness of the barrier pattern is equal to or less than about 10 Å, wherein the conductive structure includes:

a second conductive pattern; and a first conductive pattern covering a lower surface and a sidewall of the second conductive pattern, wherein upper surfaces of the first and second conductive patterns are substantially coplanar with each other, and wherein a maximum diameter of a grain in the metal included in the conductive structure is in a range of about 8 nm to about 15 nm.

18. The semiconductor device as claimed in claim 17, further comprising:

a first insulating interlayer disposed on the source/drain layer;

a second insulating interlayer disposed on the first insulating interlayer; and a second contact plug extending through the second insulating interlayer and electrically connected to the gate structure, wherein the first contact plug structure extends through the first and second insulating interlayers.

19. The semiconductor device as claimed in claim 18, wherein a lowermost surface of the first contact plug structure is lower an uppermost surface of the source/drain layer.

20. The semiconductor device as claimed in claim 17, wherein each of the first and second conductive patterns does not include boron or silicon.

21. The semiconductor device as claimed in claim 17, wherein the first conductive pattern does not include boron or silicon, and wherein the second conductive pattern includes boron or silicon.

* * * * *